(12) United States Patent
Shimada et al.

(10) Patent No.: US 8,963,051 B2
(45) Date of Patent: Feb. 24, 2015

(54) HEAT TREATMENT APPARATUS AND METHOD OF MANUFACTURING SUBSTRATES

(75) Inventors: Tomoharu Shimada, Komatsu (JP); Akira Morohashi, Utsunomiya (JP); Kojiro Yokozawa, Toyama (JP); Keishin Yamazaki, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1344 days.

(21) Appl. No.: 11/662,573

(22) PCT Filed: Sep. 15, 2005

(86) PCT No.: PCT/JP2005/017040
§ 371 (c)(1),
(2), (4) Date: Jun. 14, 2007

(87) PCT Pub. No.: WO2006/030857
PCT Pub. Date: Mar. 23, 2006

(65) Prior Publication Data
US 2008/0190910 A1 Aug. 14, 2008

(30) Foreign Application Priority Data

Sep. 16, 2004 (JP) ................................. 2004-269311
May 19, 2005 (JP) ................................. 2005-146517

(51) Int. Cl.
*F27B 5/14* (2006.01)
*F27D 11/00* (2006.01)
*C23C 16/00* (2006.01)
*H01L 21/67* (2006.01)

(52) U.S. Cl.
CPC ............................. *H01L 21/67109* (2013.01)

USPC ........................... 219/390; 219/385; 118/725

(58) Field of Classification Search
USPC ......... 219/390, 385, 386, 391, 406, 407, 408, 219/436, 460.1, 461.1; 438/786, 770, 778; 118/715, 733, 724, 725, 728; 29/890.142
See application file for complete search history.

(56) References Cited

U.S. PATENT DOCUMENTS 5,016,567 A * 5/1991 Iwabuchi et al. ............. 118/733
5,458,685 A * 10/1995 Hasebe et al. ................ 118/724
(Continued)

FOREIGN PATENT DOCUMENTS

JP  A 05-160042   6/1993
JP  A 09-097767   4/1997
(Continued)

*Primary Examiner* — Henry Yuen
*Assistant Examiner* — Hemant Mathew
(74) *Attorney, Agent, or Firm* — Oliff PLC

(57) ABSTRACT

A heat treatment apparatus wherein a nozzle is accurately provided on an adaptor to prevent the nozzle from interfering with other part items and a possibility of breakage due to heat expansion of the nozzle can be reduced. The heat treatment apparatus (10) is provided with a reaction tube (42) for treating a substrate (54), a quartz adaptor (44) for supporting the reaction tube (42), a nozzle (66) connected to the adaptor (44) for supplying a treatment gas into the reaction tube (42), and a heater (46) provided outside the reaction tube (42) for heating inside the reaction tube (42). The nozzle (66) is connected to an upper plane of the adaptor (44) in the reaction tube (42) at least a part which is of the nozzle (66) and is connected with the adaptor (44) is made of quartz and other nozzle parts are made of silicon carbide.

13 Claims, 12 Drawing Sheets

(56) References Cited

U.S. PATENT DOCUMENTS

| | | | | |
|---|---|---|---|---|
| 5,632,820 A | * | 5/1997 | Taniyama et al. | 118/724 |
| 6,225,602 B1 | * | 5/2001 | Buijze et al. | 219/390 |
| 6,712,909 B2 | * | 3/2004 | Tometsuka | 118/725 |
| 2003/0015138 A1 | * | 1/2003 | Tometsuka | 118/715 |
| 2004/0033361 A1 | * | 2/2004 | Hamaguchi | 428/408 |
| 2006/0048707 A1 | * | 3/2006 | Lei et al. | 118/715 |

FOREIGN PATENT DOCUMENTS

| | | | | |
|---|---|---|---|---|
| JP | A 10-256245 | | 9/1998 | |
| JP | A 11-102876 | | 4/1999 | |
| JP | 2002299273 A | * | 10/2002 | H01L 21/22 |
| JP | A 2002-299273 | | 10/2002 | |

\* cited by examiner

HEAT TREATMENT APPARATUS AND METHOD OF MANUFACTURING SUBSTRATES

TECHNICAL FIELD

The present invention relates to a heat treatment apparatus for applying a heat treatment to a semiconductor wafer and a glass substrate.

BACKGROUND ART

A heat treatment apparatus of this type includes a reaction tube, an adaptor for supporting the reaction tube, a nozzle for supplying treatment gas into the reaction tube, and a heater provided outside the reaction tube for heating the interior of the reaction tube, so that the heater heats up the interior of the reaction tube to a high temperature for treating a substrate. For example, in a treatment at a temperature higher than 1200° C., quarts cannot be used for the reaction tube or the nozzle. Therefore, SiC (silicon carbide) is used. However, since the SiC reaction tube becomes damaged due to temperature difference with the configuration of the SiC reaction tube, the reactor port cannot be formed of the SiC. Therefore, it is considered to form the reaction tube of SiC, and form the adapter of quartz (see Paragraph 0005, specification of Patent Document 1).

Patent Document 1: JP-A-9-97767

DISCLOSURE OF INVENTION

Problems to be Solved by the Invention

For example, in the vertically installed heat treatment apparatus, the aforementioned nozzle is formed of a pipe having an inner diameter on the order of 10 mm, a length of 1000 mm or longer. It is difficult to form such nozzle of SiC at a high degree of accuracy. When the accuracy of the nozzle is low, there may arise inclination or eccentricity and hence the nozzle interferes with the boat or the substrate unless a clearance with respect to a boat (substrate supporting member) to be loaded in the reaction tube or the substrate placed on the boat makes large. When the nozzle formed of SiC is attached directly to the adaptor formed of quartz, the nozzle may become damaged due to thermal expansion of the nozzle.

It is an object of the present invention to provide a heat treatment apparatus in which a nozzle is provided on an adaptor with high degree of accuracy to prevent the nozzle from interfering with other components, and likelihood of occurrence of damage of the nozzle due to thermal expansion of the nozzle may be reduced.

Means for Solving the Problem

In order to solve the above-described problem, a first characteristic of the present invention is a heat treatment apparatus including a reaction tube for treating a substrate, an adaptor for supporting the reaction tube, a nozzle for supplying treatment gas into the reaction tube, and a heater for heating the interior of the reaction tube, wherein the nozzle includes a first portion to be connected to an upper surface of the adaptor in the reaction tube, and a second portion to be connected to the first portion, and the first portion is formed of a material having the equal coefficient of thermal expansion as the adapter.

Preferably, the first portion of the nozzle is formed of a material having a lower coefficient of thermal expansion than the second portion of the nozzle. Preferably, the first portion of the nozzle is formed of quartz, and the second portion of the nozzle is formed of silicon carbide. Preferably, the first portion of the nozzle is fitted and connected to the adaptor on the upper surface of the adaptor. Preferably, the first portion of the nozzle and the second portion of the nozzle are fitted and connected and part of the first portion is fitted into the second portion. Preferably, the first portion of the nozzle is adapted to allow gas to flow in a direction different from the vertical direction, and the second portion of the nozzle is adapted to allow gas to flow in the vertical direction. Preferably, a supporting tool for supporting a plurality of the substrates in the reaction tube is provided and the first portion of the nozzle extends circumferentially along an inner wall of the reaction tube, and the second portion of the nozzle extends in the direction of arrangement of the substrates. Preferably, the cross-sectional area of a flow channel in the first portion of the nozzle is larger than the cross-sectional area of a flow channel in the second portion of the nozzle. Preferably, the first portion or the second portion of the nozzle is configured so that the gas flows at a lower flow rate in the first portion than in the second portion. Preferably, the first portion of the nozzle is placed on the upper surface of the adaptor in the reaction tube, and the cross-sectional shape of the flow channel in the first portion of the nozzle is a rectangular shape. Preferably, the first portion of the nozzle is placed on the upper surface of the adaptor in the reaction tube and the cross-sectional shape of the flow channel in the first portion of the nozzle is a vertically elongated rectangular shape. Preferably, the nozzle has at least two second portions.

A second characteristic of the present invention is a heat treatment apparatus including a reaction tube for treating substrates, an adaptor for supporting the reaction tube, a nozzle for supplying treatment gas into the reaction tube, a heater for heating the interior of the reaction tube, and a supporting tool for supporting a plurality of the substrates in the reaction tube, wherein the nozzle includes a first portion to be connected to an upper surface of the adaptor in the reaction tube, and a second portion to be connected to the first portion, and the first portion extends circumferentially along an inner wall of the reaction tube and the second portion of the nozzle extends in the direction of arrangement of the substrates.

A third characteristic of the present invention is a heat treatment apparatus including a reaction tube for treating a substrate, an adaptor for supporting the reaction tube, a nozzle for supplying treatment gas into the reaction tube, and a heater for heating the interior of the reaction tube, wherein the nozzle includes a first portion to be connected to an upper surface of the adaptor in the reaction tube, and a second portion to be connected to the first portion, and the cross-sectional area of a flow channel in the first portion is larger than the cross-sectional area of a flow channel in the second portion.

A fourth characteristic of the present invention is a method of manufacturing a substrate including the steps of loading the substrate into a reactor having a reaction tube, an adaptor for supporting the reaction tube, and a heater for heating the interior of the reaction tube, supplying treatment gas into the reactor by a nozzle including a first portion to be connected to an upper surface of the adaptor in the reaction tube and a second portion to be connected to the first portion, the first portion being formed of a material equivalent in coefficient of thermal expansion to the adaptor and treating the substrate, and unloading the substrates after treatment from the reactor.

A fifth characteristic of the present invention is a heat treatment apparatus including a reaction tube for treating substrates, an adaptor formed of quartz for supporting the reaction tube, a nozzle connected to the adaptor for supplying treatment gas into the reaction tube, and a heater provided outside the reaction tube for heating the interior of the reaction tube, wherein the nozzle is connected to an upper surface of the adaptor in the reaction tube, at least a portion of the nozzle connected to the adaptor is formed of quartz, and other portions thereof are formed of silicon carbide.

Preferably, the portion formed of quartz and the portion formed of silicon carbide of the nozzle are fitted and connected. Preferably, the portion of the nozzle formed of quartz is fitted into the portion formed of silicon carbide. Preferably, the portion of the nozzle formed of quartz is fitted and connected to the adaptor. Preferably, the nozzle extends to a level above a substrate arranged area along an inner wall of the reaction tube. Preferably, the portion of the nozzle formed of silicon carbide is formed via a CVD.

A sixth characteristic of the present invention is a heat treatment apparatus including a reaction tube for treating substrates, an adaptor for supporting the reaction tube, a nozzle connected to the adaptor for supplying treatment gas into the reaction tube, and a heater provided outside the reaction tube for heating the interior of the reaction tube, wherein the nozzle is connected to an upper surface of the adaptor in the reaction tube, and includes a portion extending along the adaptor or circumferentially along the inner wall of the reaction tube and a portion extending in the direction of arrangement of the substrates.

Preferably, the cross-sectional area of a gas flow channel in a portion of the nozzle extending along the adaptor or circumferentially along the inner wall of the reaction tube is larger than the cross-sectional area of a gas flow channel in a portion extending in the direction of arrangement of the substrates.

Preferably, the shape of a portion of the nozzle extending along the adaptor or circumferentially along the inner wall of the reaction tube is a non-circular shape.

Preferably, the portion of the nozzle extending along the adaptor or circumferentially along the inner wall of the reaction tube is formed of quartz, and the portion extending in the direction of arrangement of the substrates is formed of silicon carbide. Preferably, the portion of the nozzle extending along the adaptor or circumferentially along the inner wall of the reaction tube and the portion extending in the direction of arrangement of the substrates are fitted and connected to each other. Preferably, the portion of the nozzle extending along the adaptor or circumferentially along the inner wall of the reaction tube is formed of quartz, and the portion thereof extending in the direction of arrangement of the substrates is formed of silicon carbide, and the portion of the nozzle extending along the adaptor or circumferentially along the inner wall of the reaction tube is fitted into the portion extending in the direction of arrangement of the substrates. Preferably, the portion of the nozzle extending along the adaptor or circumferentially along the inner wall of the reaction tube is fitted and connected to the adaptor. Preferably, the portion of the nozzle extending in the direction of arrangement of the substrates extends along the inner wall of the reaction tube to a level above a substrate arranged area. Preferably, the portion of the nozzle extending in the direction of arrangement of the substrates is formed of silicon carbide, and is formed via a CVD.

Preferably, the reaction tube is formed of SiC. Preferably, the reaction tube includes a substrate supporting tool to be loaded therein for supporting the plurality of substrates in a plurality of states in substantially horizontal direction with gaps therebetween. The treatment in the present invention is performed at high temperatures, preferably, at 1000° C. or higher, at 1200° C. or higher, or at 1350° C. or higher.

Figure 1:
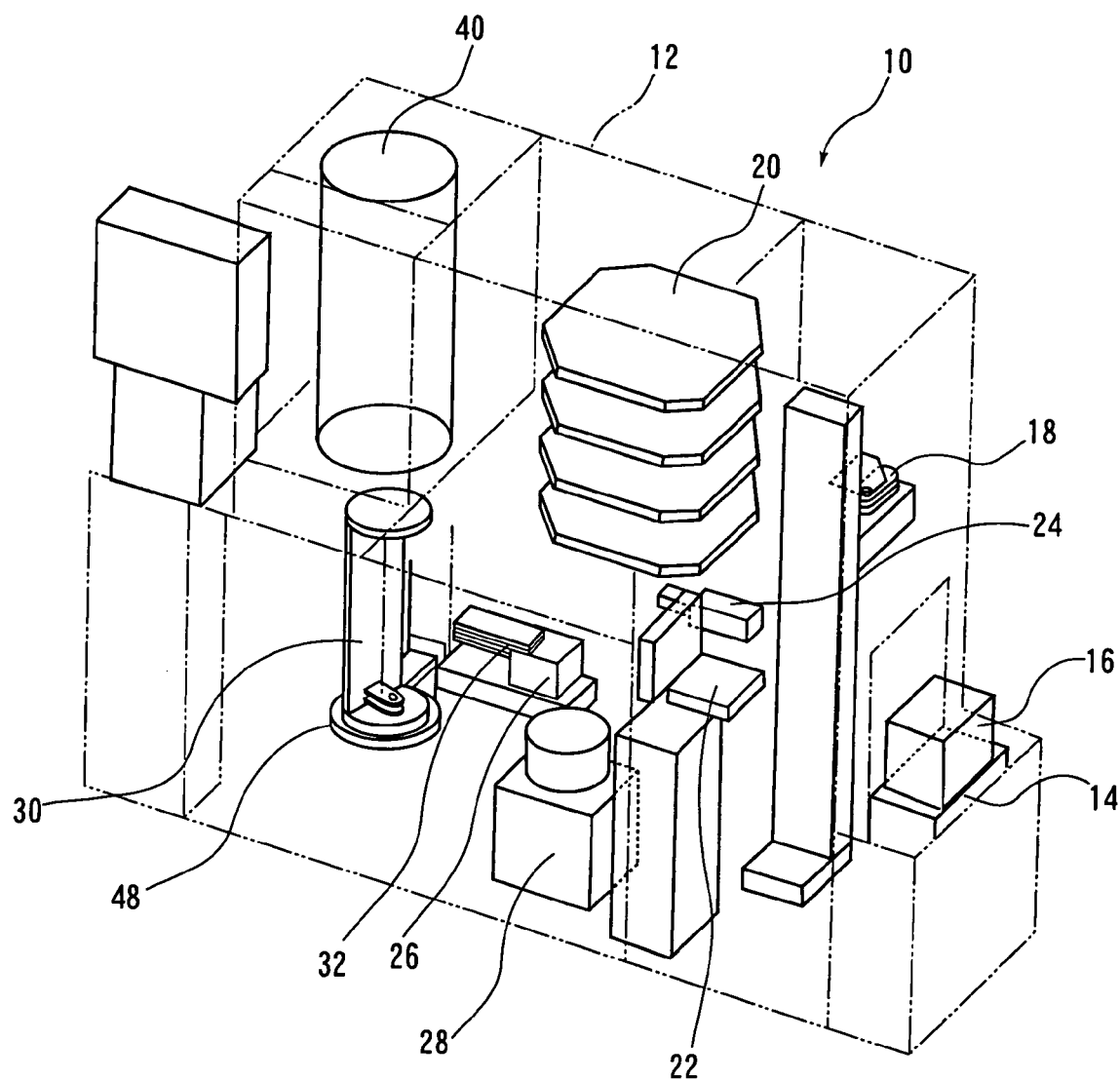
FIG. 1 is a perspective view schematically showing a heat treatment apparatus according to an embodiment of the present invention.

REFERENCE NUMERALS 10 heat treatment apparatus
26 substrate transfer unit
30 substrate supporting member
40 reactor
42 reaction tube
44 adaptor
46 heater 48 reactor port seal cap
54 substrate
56 gas supply port
60 gas introduction pipe
66 nozzle
66a first portion
66b second portion

BEST MODE FOR CARRYING OUT THE
INVENTION

Referring now to the drawings, an embodiment of present invention will be described.

FIG. 1 shows an example of a heat treatment apparatus according to an embodiment of the present invention. The treatment apparatus 10 is, for example, a vertically installing type, and includes a casing 12 in which a principle portion is arranged. The casing 12 is connected to a pod stage 14, and a pod 16 is transported to the pod stage 14. The pod 16 accommodates, for example, twenty-five pieces of substrates (wafers) and is mounted to the pod stage 14 in a state of being closed by a lid, not shown.

A pod transporting device 18 is arranged on the front side in the casing 12 at a position opposed to the pod stage 14. A pod shelf 20, a pod opener 22 and a substrate number sensor 24 are arranged in the vicinity of the pod transporting device 18. The pod shelf 20 is arranged above the pod opener 22, and the substrate number sensor 24 is arranged adjacently to the pod opener 22. The pod transporting device 18 transports the pod 16 among the pod stage 14, the pod shelf 20, and the pod opener 22. The pod opener 22 serves to open the lid of the pod 16, and the number of substrates in the pod 16 whose lid is opened is sensed by the substrate number sensor 24.

In the casing 12, a substrate transfer unit 26, a notch aligner 28, and a substrate supporting member (boat) 30 used as a supporting tool for supporting the plurality of substrates are arranged. The substrate transfer unit 26 includes an arm (tweezer) 32 that is able to take out, for example, five substrates, and the substrates are transported among the pod placed at a position of the pod opener 22, the notch aligner 28, and the substrate supporting member 30 by moving the arm 32. The notch aligner 28 detects notches or orientation flats formed on the substrates and aligns the notches or the orientation flats of the substrates at a certain position. A reactor 40 is arranged in the upper portion on the back side in the casing 12. In this reactor 40, the substrate supporting member 30 having the plurality of substrates mounted therein is transported into the reactor 40, where a heat treatment is performed.

Figure 2:
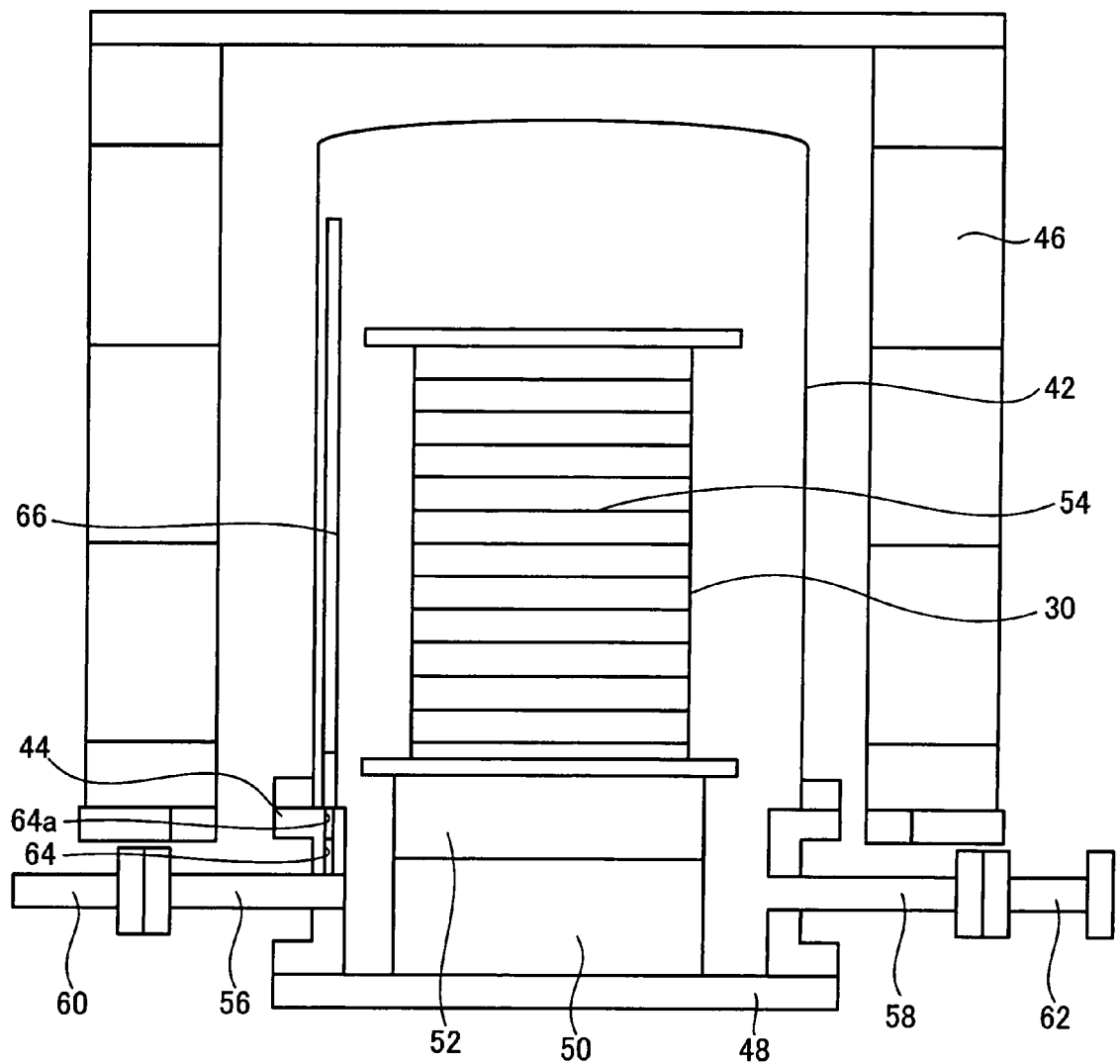
FIG. 2 is a cross-sectional view showing a reactor used in the heat treatment apparatus according to the embodiment of the present invention.

FIG. 2 shows an example of the reactor 40. The reactor 40 includes a reaction tube 42 formed of SiC, which is used as a reaction tube for treating the substrates. The reaction tube 42 is formed into a cylindrical shape closed at the upper end thereof and opened at the lower end thereof, and the opened lower end is formed into a flange shape. An adaptor 44 formed of quartz is arranged below the reaction tube 42, and the reaction tube 42 is supported by the adaptor 44. The adaptor 44 has a cylindrical shape opened on the upper end and the lower end thereof, and the opened upper end and the lower end are formed into a flange shape. The lower surface of a lower end flange of the reaction tube 42 abuts against the upper surface of an upper end flange of the adaptor 44. The reaction tube 42 and the adaptor 44 constitute a reaction container 43. A heater 46 that heats the interior of the reaction tube 42 is arranged around the reaction tube 42 of the reaction container 43 except for the adaptor 44. The lower side of the reaction container 43 configured of the reaction tube 42 and the adaptor 44 is opened for inserting the substrate supporting member 30, and the opened portion (reactor port) is adapted to be sealed by a reactor port seal cap 48 coming into abutment with the lower surface of the lower end flange of the adaptor 44 with the intermediary of an O-ring. The reactor port seal cap 48 supports the substrate supporting member 30, and is provided so as to be capable of moving upward and downward with the substrate supporting member 30. Provided between the reactor port seal cap 48 and the substrate supporting member 30 is a first heat-insulating member 50 formed of quartz and a second heat-insulating member 52 formed of SiC arranged on the first heat-insulating member 50. The substrate supporting member 30 is mounted into the reaction tube 42 with a number of, for example, twenty-five to one hundred substrates 54 supported in a number of stages substantially horizontally with gaps therebetween.

The reaction tube 42 is formed of SiC for enabling a treatment at a high temperature of 1200° C. or higher. When a configuration in which the reaction tube 42 formed of SiC is extended to the reactor port and the reactor port formed of SiC is sealed by the reactor port seal cap 48 via the O-ring is employed, the temperature of the sealing portion is also increased to a high temperature by heat transmitted via the reaction tube formed of SiC, and hence the O-ring as a sealing material may be melted. When the sealing portion of the reaction tube 42 formed of SiC is cooled so as to prevent the O-ring from being melted, the reaction tube 42 formed of SiC becomes damaged due to the difference in thermal expansion caused by the temperature difference. Therefore, by configuring a heated area of the reaction container 43 heated by the heater 46 with the reaction tube 42 formed of SiC, and configuring portion other than the heated area heated by the heater 46 with the adaptor 44 formed of quartz, transmission of heat from the reaction tube 42 formed of SiC is alleviated, so that sealing of the reactor port is achieved without melting the O-ring and without giving damage to the reaction tube 42. As regards sealing between the reaction tube 42 formed of SiC and the adaptor 44 formed of quartz, since the reaction tube 42 formed of SiC is arranged in the heated area heated by the heater 46, the temperature difference does not generated as long as the surface accuracy therebetween is good, and hence thermal expansion of the both is isotropic. Therefore, the lower end flange of the reaction tube 42 formed of SiC may be maintained to be a flat plane, and hence a gap is not generated with respect to the adaptor 44, so that the sealing property can be secured only by placing the reaction tube 42 formed of SiC on the adaptor 44 formed of quartz.

The adaptor 44 is formed with a gas supply port 56 and a gas exhaust port 58 integrally with the adaptor 44. The gas supply port 56 is connected to a gas introduction pipe 60, and the gas exhaust port 58 is connected to an exhaust pipe 62, respectively.

Figure 3A:
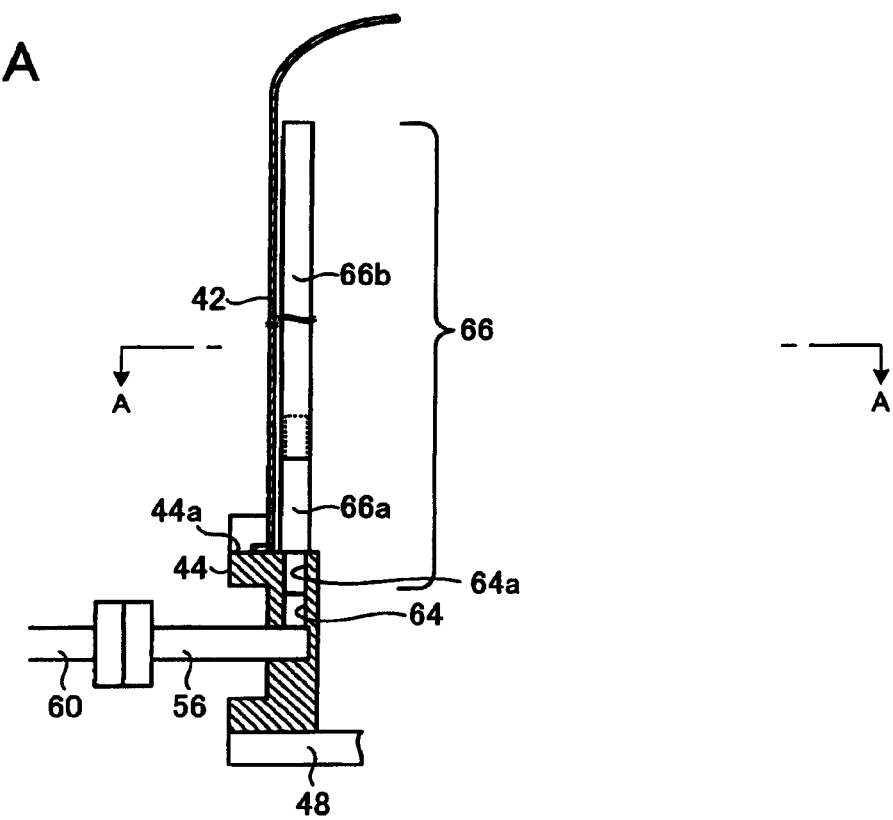
FIG. 3 illustrates a nozzle portion used in the heat treatment apparatus according to the embodiment of the present invention, in which (a) is a cross-sectional view of the nozzle portion and (b) is a cross-sectional view taken along the line A-A in (a).
Figure 3B:
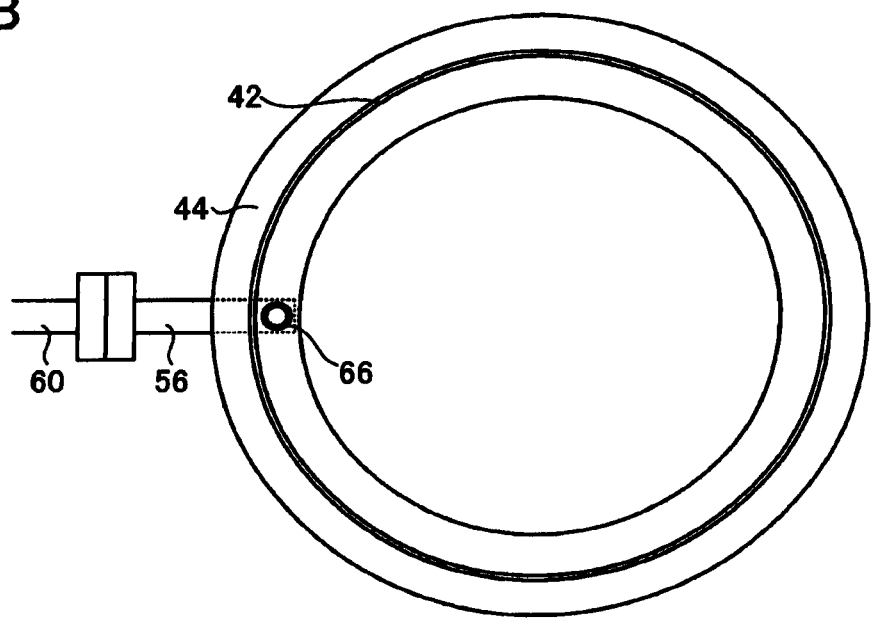

As shown in FIGS. 3(a), (b), the thickness of a side wall of the adaptor 44 is larger than the thickness of a side wall of the reaction tube 42, and is larger than the width (outer diameter) of a nozzle 66, described later. An inner wall of the adaptor 44 is located inside (protruded) with respect to an inner wall of the reaction tube 42, and the side wall (thick portion) of the adaptor 44 is provided with a gas introduction path 64, which communicates with the gas supply port 56 and is oriented in the vertical direction, and is formed with a nozzle mounting hole 64a at an upper portion thereof so as to open upward. That is, the nozzle mounting hole 64a is opened to the upper surface of the adaptor 44 on the side of the upper end flange in the reaction tube 42, and communicates with the gas supply port 56 and the gas introduction path 64. The nozzle 66 for supplying treatment gas into the reaction tube 42 is inserted and fixed to the nozzle mounting hole 64a. That is, the nozzle 66 is connected to the upper surface 44a of the adaptor 44 at a portion protruded inwardly with respect to the inner wall of the reaction tube 42 in the reaction tube 42, and hence the nozzle 66 is supported by the upper surface of the adaptor 44. In the above-described Patent Document 1, a nozzle is connected to an upper surface of a thin gas supply port 56 extending horizontally so as to penetrate through a side wall of an adaptor 44. In contrast, in this embodiment, the nozzle 66 is connected to the adaptor 44 at the upper surface of the adaptor 44, which is configured to have a thick side wall. That is, the nozzle 66 is attached to the nozzle mounting hole 64a formed on the adaptor 44 and having a sufficient thickness therearound. In this configuration, the rigidity of the portion to which the nozzle 66 is connected is increased to a high level in comparison with a connecting method described in Patent Document 1, so that the connected portion may be prevented from being deformed or being damaged easily due to heat. In addition, the nozzle 66 may be retained in a state of being stable with a high level of accuracy, and hence can be prevented from being inclined. There is also a merit that assembly and decomposition of the nozzle 66 and the adaptor 44 are facilitated. The treatment gas introduced from the gas introduction pipe 60 to the gas supply port 56 is supplied into the reaction tube 42 via the gas introduction path 64 and the nozzle 66 provided on the side wall of the adaptor 44.

The nozzle 66 is configured so as to extend vertically from the position of the nozzle mounting hole 64a to a point above the upper end of a substrate arranged area (above the upper end of the substrate supporting member 30) along the inner wall of the reaction tube 42. The nozzle 66 is formed into a cylindrical shape, and, for example, has an inner diameter of 10 mm, and a length of 1000 mm.

Figure 4:
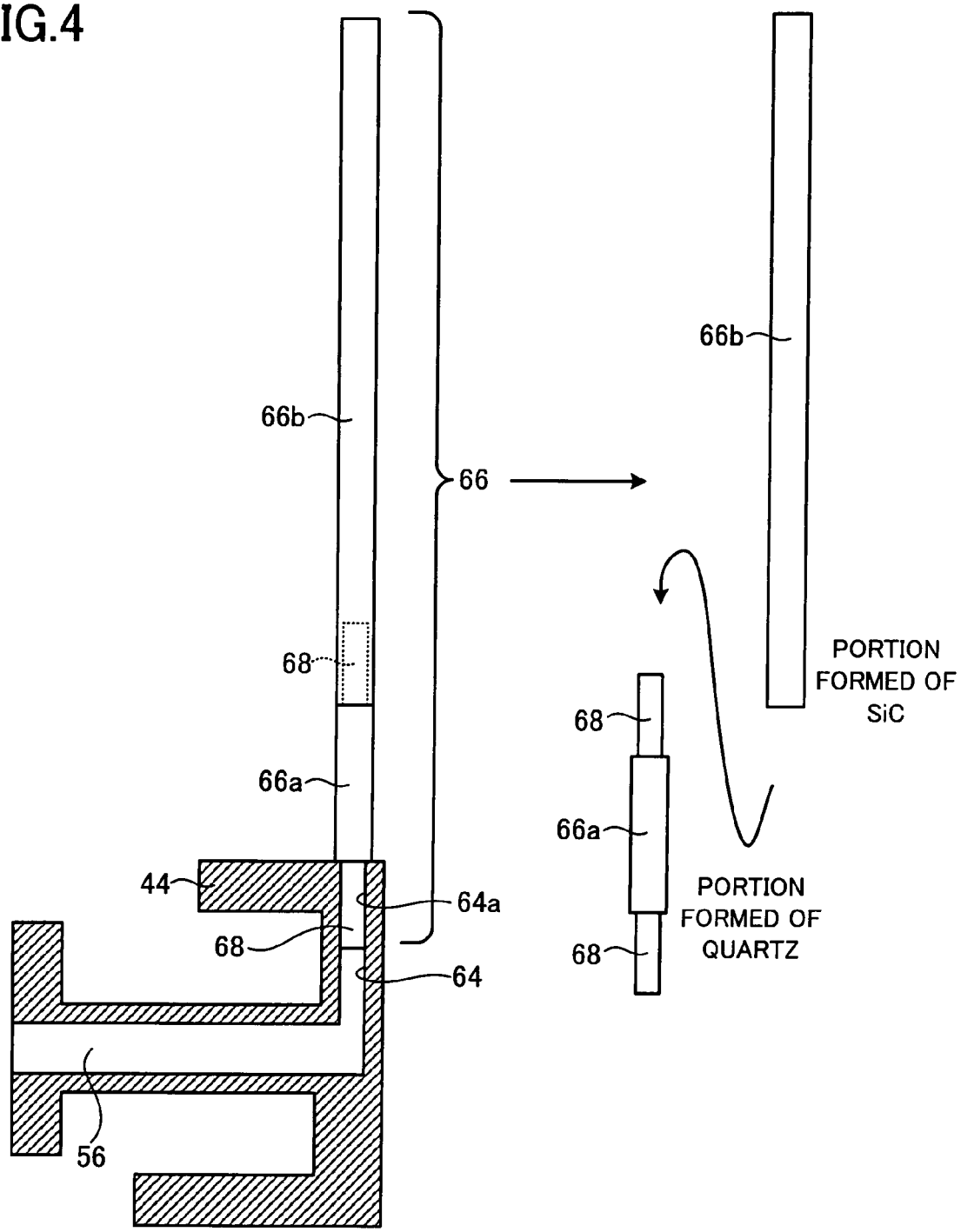
FIG. 4 illustrates a cross-sectional view and an exploded view showing the nozzle portion used in the heat treatment apparatus according to the embodiment of the present invention.

As shown in FIG. 4, the nozzle 66 includes two portions; a first portion 66a connected to the upper surface of the adaptor 44 in the reaction tube 42 and a second portion 66b connected to the first portion 66a. The first portion 66a is formed of quartz, and is formed into a cylindrical shape. The first portion 66a formed of quartz is adjacent to the adaptor 44, and is formed at both outer edge portions with small depressions (small diameter portions) 68 having an outer diameter smaller than other portions. One of the depressions 68 of the first portion 66a is fitted to the nozzle mounting hole 64a of the adaptor 44, and the other depression 68 is fitted into the lower end portion of the second portion 66b. That is, the first portion 66a of the nozzle 66 is fitted and connected to the adaptor 44 at an upper surface of the adaptor 44, the first portion 66a of the nozzle 66 and the second portion 66b of the nozzle 66 are fitted and connected to each other, and part of the first portion 66a is fitted into the second portion 66b. The first portion 66a is arranged in an area that does not face the heater 46 in such a manner that the upper end thereof is located below the lower end of the heater 46. The second portion 66b is formed of SiC, and is formed into a cylindrical shape. The distal end (upper end) of the second portion 66b is opened upward, that is, toward a ceiling of the reaction tube 42, and this opening defines a gas injection port. The second portion 66b formed of SiC maybe formed, for example, of CVD. The first portion 66a is arranged in an area in which the temperature is relatively low, that is, not higher than 1200° C., and the second portion 66b is arranged in an area in which the temperature is relatively high.

In this manner, the nozzle 66 is configured with the two portions of 66a and 66b fitted and connected to each other, and has a structure of, so-called, a socket-and-spigot.

In this embodiment, there is only one nozzle 66. However, the invention is not limited thereto, and may include a plurality of the nozzles 66 as long as there is at least one nozzle.

Subsequently, an operation of the heat treatment apparatus 10 configured as described above will be described.

When the pod 16 in which the plurality of substrates are stored is mounted to the pod stage 14, the pod 16 is transported from the pod stage 14 to the pod shelf 20 by the pod transporting device 18 and is stocked on the pod shelf 20. Subsequently, the pod 16 stocked on the pod shelf 20 is transported to the pod opener 22 by the pod transporting device 18 and is mounted thereto, the lid of this pod 16 is opened by the pod opener 22, and the number of substrates stored in the pod 16 is sensed by the substrate number sensor 24.

Subsequently, the substrates are taken out from the pod 16 positioned at the pod opener 22 by the substrate transfer unit 26, and are transferred to the notch aligner 28. The notch aligner 28 detects notches while rotating the substrates, and aligns the notches of the plurality of substrates at the same position on the basis of detected information. Then, the substrates are taken out from the notch aligner 28 and are transferred to the substrate supporting member 30 by the substrate transfer unit 26.

In this manner, when a batch of the substrates are transferred to the substrate supporting member 30, the substrate supporting member 30 in which the plurality of substrates 54 are mounted is loaded into the reactor 40 (the reaction container 43) which is set to a temperature on the order of, for example, 600° C., and the reaction tube 42 is sealed by the reactor port seal cap 48. Then, the temperature in the reactor is increased to a heat treatment temperature, and treatment gas is introduced into the reaction tube 42 from the gas introduction pipe 60 through the gas supply port 56, the gas introduction path 64 provided on the side wall of the adaptor 44, and the nozzle 66. The treatment gas includes nitrogen ($N_2$), Argon (Ar), hydrogen ($H_2$), oxygen ($O_2$). When heat-treating the substrate 54, the substrates 54 are heated to a temperature on the order of, for example, 1200° C. or higher.

When the heat treatment of the substrates 54 are terminated, the reactor temperature is lowered to a temperature on the order of, for example, 600° C., then the substrate supporting member 30 supporting the substrates 54 after having applied the heat treatment is unloaded from the reactor 40, and the substrate supporting member 30 is caused to stay at a predetermined position until all the substrates 54 supported by the substrate supporting member 30 are cooled down. Subsequently, when the substrates 54 in the substrate supporting member 30 which has been caused to wait are cooled to a predetermined temperature, the substrates 54 are taken out from the substrate supporting member 30 by the substrate transfer unit 26, and are transported to and stored in the empty pod 16 mounted to the pod opener 22. Subsequently, the pod 16 in which the substrates 54 are stored is transported to the pod shelf 20 by the pod transporting device 18, and is further transported to the pod stage 14, so that a series of treatments is completed.

As described before, since the reaction tube 42 is formed of SiC, and the portion of the nozzle 66 whose temperature is increased to a relatively high temperature is formed of Sic, a problem such that these members are melted does not occur even when the temperature in the reaction tube 42 is increased to a high temperature of 1200° C. or higher. Since the adapter 44 and the first portion 66a of the nozzle 66 adjacent to the adaptor 44 are formed of quartz, these members may be machined, mounted, and demounted easily. Since the adapter 44 and the first portion 66a of the nozzle 66 adjacent to the adaptor 44 are formed of quartz, the first portion 66a of the nozzle 66 is formed of a material having the equivalent coefficient of thermal expansion as the adaptor 44. Therefore, even when both of the adaptor 44 and the first portion 66a are thermally expanded in a state in which part of the first portion 66a is fitted to the nozzle mounting hole 64a of the adaptor 44, damage or the like of the both members caused by the thermal expansion may be prevented. Although the first portion 66a of the nozzle 66 is formed of quartz, since it is arranged in the respectively low temperature area the temperature of which does not reach 1200° C., a problem of melting or the like does not occur. The first portion 66a formed of quartz and the second portion 66b formed of SiC connected to the first small nozzle 66a are prevented from breaking or the like at the connecting portion thereof since a part of the first portion 66a is fitted into the second portion 66b. That is, since quartz is smaller in coefficient of thermal expansion in comparison with SiC, and the first portion 66a of the nozzle 66 is formed of a material having a coefficient of thermal expansion lower than the second portion 66b of the nozzle 66, likelihood of breakage of the both members due to the thermal expansion is lowered by fitting the part of the first portion formed of quartz into the second portion formed of SiC. When the first portion 66a of the nozzle 66 is formed of SiC, since Sic has a larger coefficient of thermal expansion than quartz, the coefficient of thermal expansion of the first portion 66a is larger than that of the adapter 44 formed of quartz. In this case, when both of the adaptor 44 and the first portion 66a are thermally expanded in a state in which part of the first portion 66a is fitted to the nozzle mounting hole 64a of the adaptor 44, at least one of the adaptor 44 and the first portion 66a maybe broken. In addition, since the portion 66b formed of SiC is formed with a high degree of accuracy by CVD, the problem of accuracy in diameter, straightness, and eccentricity of the nozzle 66 can be solved.

In description of the above-described embodiment and example, the heat treatment apparatus of a batch type, which heat-treats the plurality of substrates, is employed. However, the invention is not limited thereto, and a sheet-fed type may also be employed.

Figure 5A:
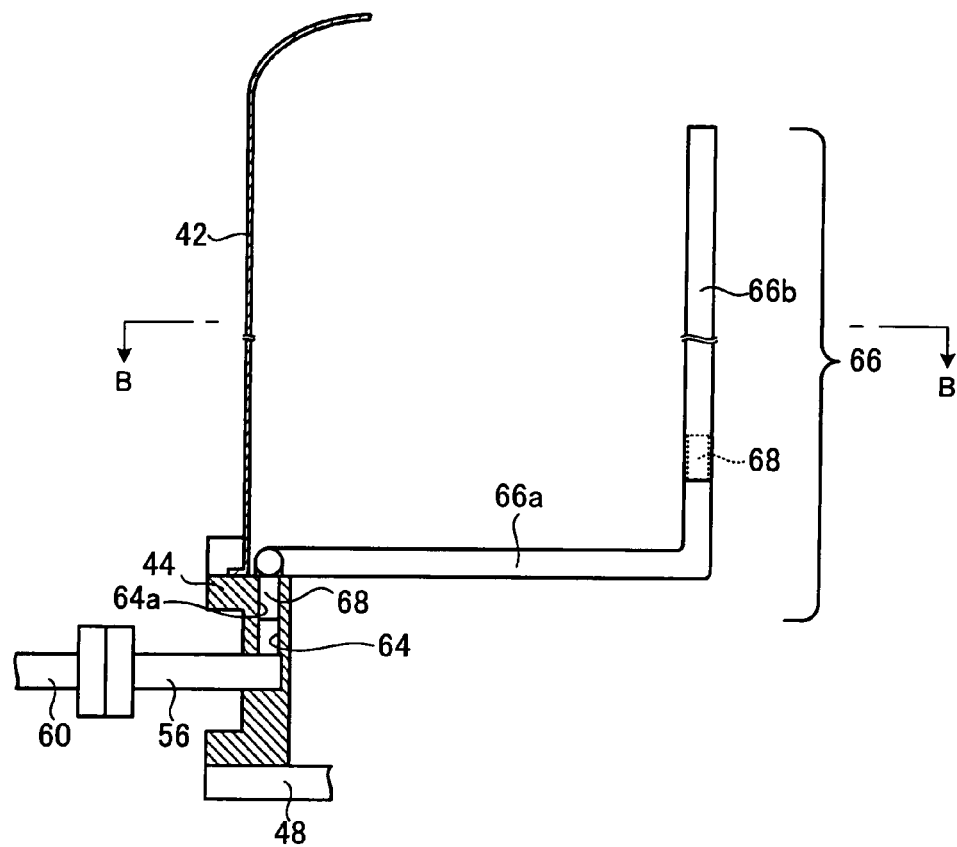
FIG. 5 illustrates nozzle portion used in the heat treatment apparatus according to a second embodiment of the present invention, in which (a) is a cross-sectional view of the nozzle portion and (b) is a cross-sectional view taken along the line B-B in (a).
Figure 5B:
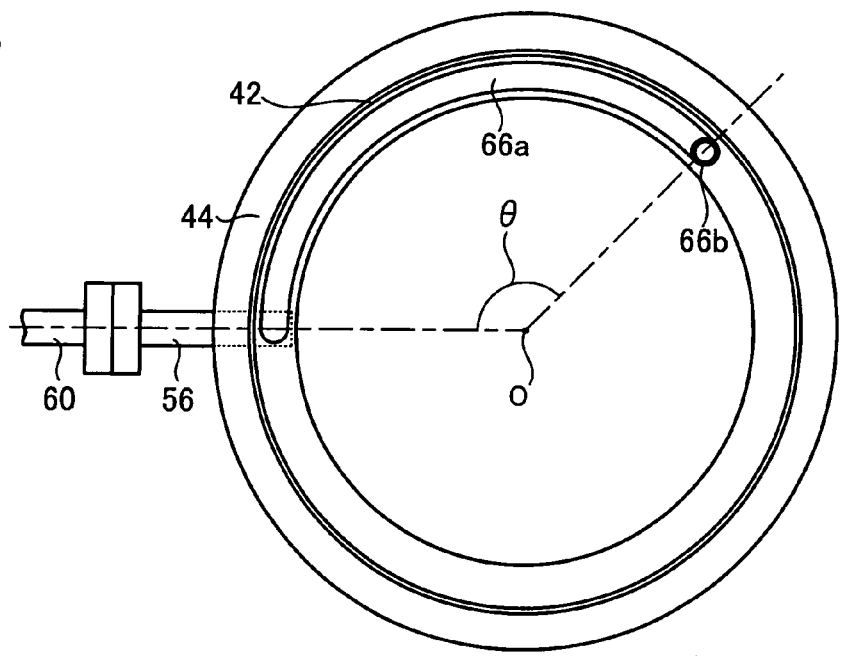
Figure 6:
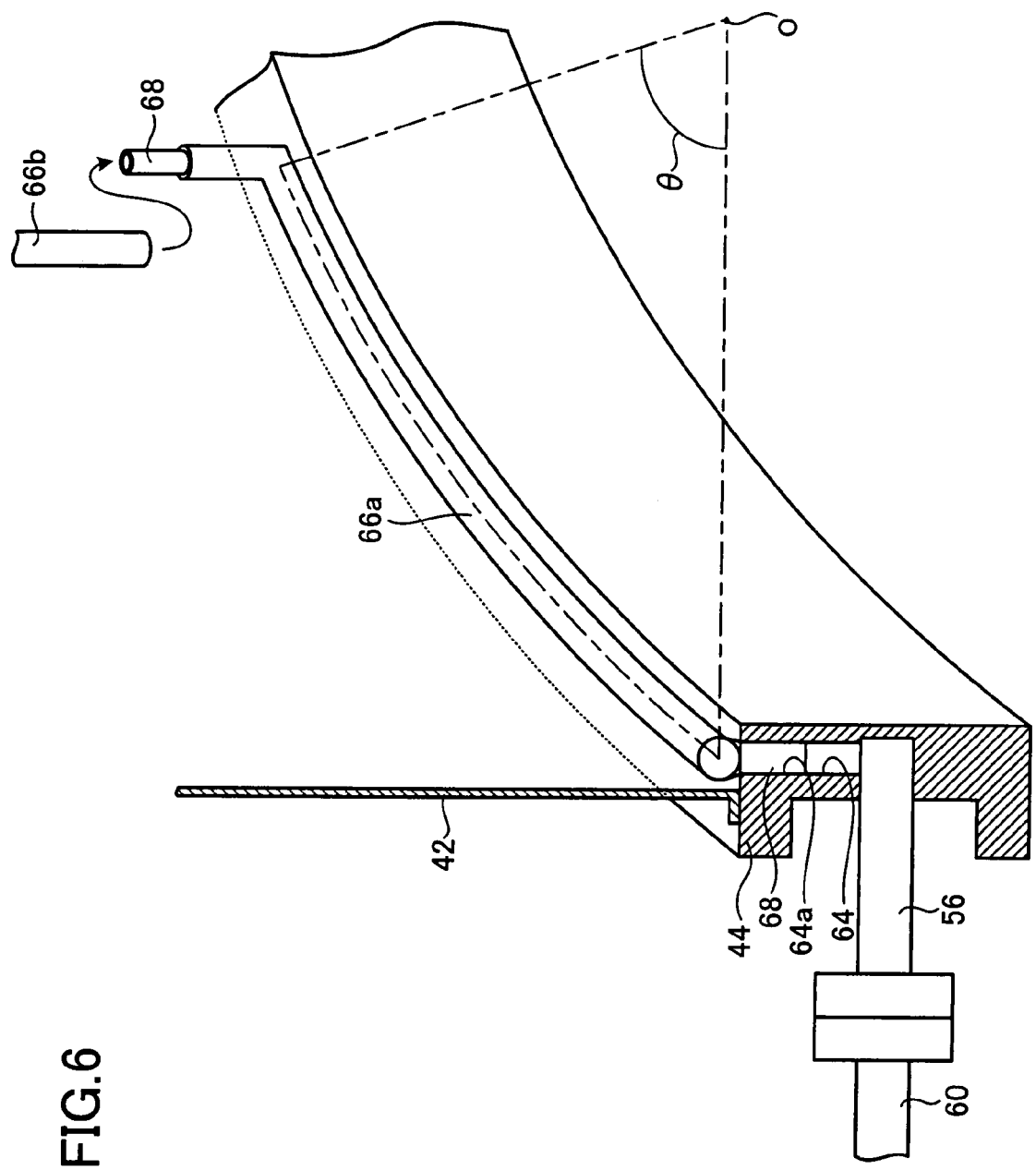
FIG. 6 is an enlarged perspective view showing the nozzle portion used in the heat treatment apparatus according to the second embodiment of the present invention.

Referring now to FIG. 5 and FIG. 6, a second embodiment of the present invention will be described.

The members described in the first embodiment are represented by the same reference numerals, and overlapped description will be omitted.

As shown in FIG. 5 and FIG. 6, the nozzle 66 includes the two portions 66a, 66b. The first portion 66a is formed of quartz, placed on the upper surface of the adaptor 44 on the side of the upper end flange in the reaction tube 42, and is formed at the both outer edge portions with the small depressions (small diameter portions) 68 having an outer diameter smaller than other portions. One of the depressions 68 of the first portion 66a is fitted to the nozzle mounting hole 64a of the adaptor 44, and the other depression 68 is fitted into the lower end of the second portion 66b.

As shown in FIGS. 5(a), (b), the first portion 66a includes a curved portion and a straight portion, and the curved portion is formed into an arcuate shape circumferentially along the inner wall of the reaction tube 42 while keeping in adjacent to the upper surface of the adaptor 44. That is, the curved portion of the first portion 66a is placed on the upper surface of the adaptor 44 in the reaction tube 42 between the inner wall of the reaction tube 42 and the inner peripheral edge of the adaptor 44, and is provided concentrically with the reaction tube 42 and circumferentially along the inner wall of the reaction tube 42. In this embodiment, the curved portion of the first portion 66a of the nozzle 66 is in contact with the upper surface of the adaptor 44 at a portion protruding inwardly with respect to the inner wall of the reaction tube 42, and the curved portion of the first portion 66a is supported by the upper surface. The nozzle 66 (the first portion 66a, the second portion 66b) are arranged so as not to come into contact with the reaction tube 42 (so as to define a space between the nozzle 66 and the reaction tube 42). When a range in which the curved portion of the first portion 66a arranged on the upper surface of the adaptor 44 is represented by a center angle of the curved portion formed into an arcuate shape, that is, an angle θ formed by two straight lines (radii) connecting both ends of the curved portion (the position of the nozzle mounting hole 64a, the position where the straight portion of the first portion 66a is arranged) and a center point O of the curved portion, the angle θ is; θ=90 to 360°. The curved portion of the first portion 66a has a function as a preheating portion for preheating gas to be supplied into the reaction tube 42.

As shown also in FIG. 6, the first portion 66a is formed with the above-described curved portion, and further the straight portion so as to extend upright in the vertical direction from the terminal of the curved portion. The distal end of the straight portion is formed with the depressions 68 described above, and is fitted into the second portion 66b.

The second portion 66b is configured so as to extend vertically to a level above the substrate arranged area along the inner wall of the reaction tube 42 (to a level above a top of the substrate supporting member 30) in the direction of arrangement of the substrates 54 supported by the substrate supporting member 30 (see FIG. 2). The second portion 66b is formed of SiC, and is formed into a cylindrical shape. The distal end (upper end) of the second portion 66b is opened upward, that is, toward a ceiling of the reaction tube 42, and this opening defines a gas injection port. The second portion 66b formed of SiC maybe formed, for example, of CVD. The first portion 66a is arranged in an area in which the temperature is relatively low, that is, does not reach a temperature as high as 1200° C., and the second portion 66b is arranged in an area in which the temperature is relatively high.

In this manner, the nozzle 66 is configured with the two portions of 66a and 66b fitted and connected to each other, and has a structure of, so-called, a socket-and-spigot, and the first portion 66a is configured to allow gas to flow in a direction (horizontal direction) different from the vertical direction, and the second portion 66b is configured to allow gas to flow in the vertical direction.

In this embodiment, there is only one nozzle 66. However, the invention is not limited thereto, and may include a plurality of the nozzles 66 as long as there is at least one nozzle.

In this manner, by providing the first portion 66a of the nozzle 66 so as to extend circumferentially along the inner wall of the reaction tube 42 on top of the adaptor 44 formed of quartz, gas in the first portion 66a of the nozzle 66 is sufficiently preheated, so that the gas temperature in the nozzle 66 is increased. Accordingly, when the gas passed in the second portion 66b, or when the gas is further injected into a reaction chamber from the gas injection port at the distal end of the second portion 66b, the gas is sufficiently heated. Therefore, partial decrease in temperature in the reaction chamber, especially in the substrate arranged area may be prevented. That is, temperature reduction in the vicinity of the second portion 66b of the nozzle 66 and in the vicinity of the gas injection port at a distal end of the second portion 66b in the reaction tube 42 may be prevented, and hence temperature distribution in the reaction chamber, that is, temperature distribution in the direction of arrangement of the substrates (vertical direction) and the temperature distribution in the horizontal direction with respect to the surfaces of the wafers may be uniformized and, by the same logic, a uniform treatment may be performed between the surfaces of the wafers, and on the surfaces thereof.

Subsequently, a first modification of the first portion 66a in the second embodiment will be described. FIG. 7 shows the first modification of the first portion 66a.

The first portion 66a is formed of quartz, and is formed at the both outer edge portions with the small depressions (small diameter portions) 68 having an outer diameter smaller than other portions. One of the depressions 68 of the first portion 66a is fitted to the nozzle mounting hole 64a of the adaptor 44 formed of quartz, and the other depression 68 is fitted into the second portion 66b formed of SiC.

Figure 7A:
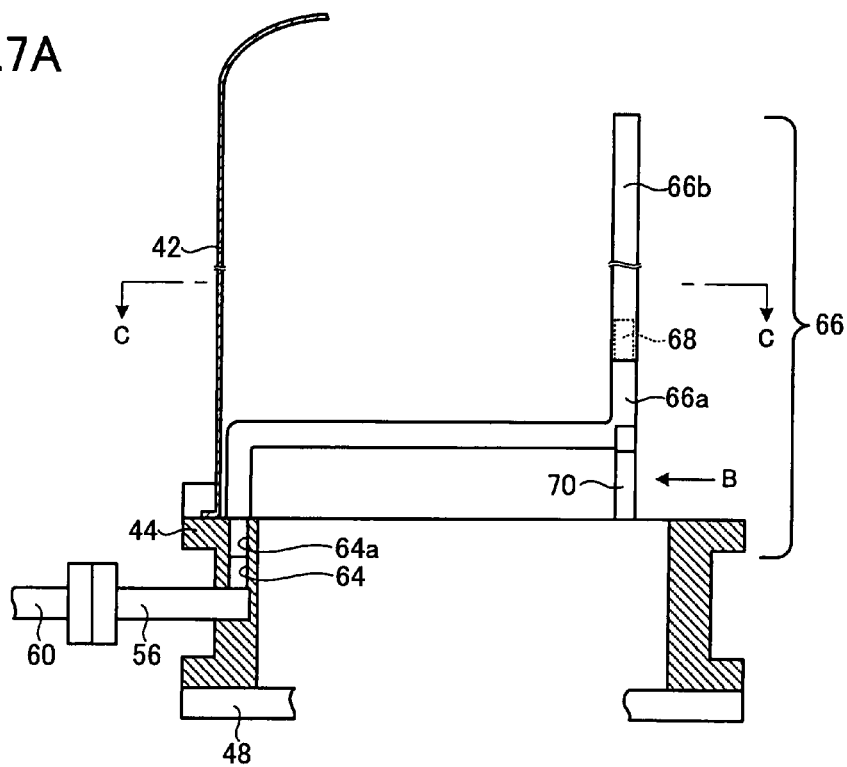
FIG. 7 illustrates a first modification of the nozzle portion used in the heat treatment apparatus according to the second embodiment of the present invention, in which (a) is a cross-sectional view of the nozzle portion, (b) is a cross-sectional view taken along the line C-C in (a), and (c) is a side cross-sectional view of a nozzle fixing claw for supporting the nozzle portion.

As shown in FIGS. 7(a), (b), the first portion 66a includes a curved portion and two straight portions, and a first straight portion is formed with the above-described depression 68 at the distal end thereof, and is fitted to the nozzle mounting hole 64a. The first straight portion is formed so as to extend in the vertical direction from the nozzle mounting hole 64a along the inner wall of the reaction tube 42. The curved portion is bent in the horizontal direction from the terminal of the first straight portion which extends in the vertical direction, and formed into an arcuate shape so as to extend circumferentially along the inner wall of the reaction tube 42. That is, the curved portion is provided concentrically with the adaptor 44 or the reaction tube 42 so as to extend circumferentially along the inner wall of the reaction tube 42 at (while maintaining) a constant distance from the upper surface of the adaptor 44 on the side of the upper end flange. The nozzle 66 (the first portion 66a, the second portion 66b) is arranged so as not to come into contact with the reaction tube 42 (so as to define a gap between the nozzle 66 and the reaction tube 42). A second straight portion is formed so as to extend upright from the terminal end of the above-described curved portion further in the vertical direction. The second straight portion is formed with the above-described depression 68 at the distal end thereof and is fitted into the second portion 66b of the nozzle 66.

Figure 7C:
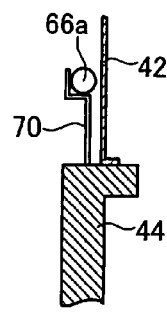
Figure 7B:
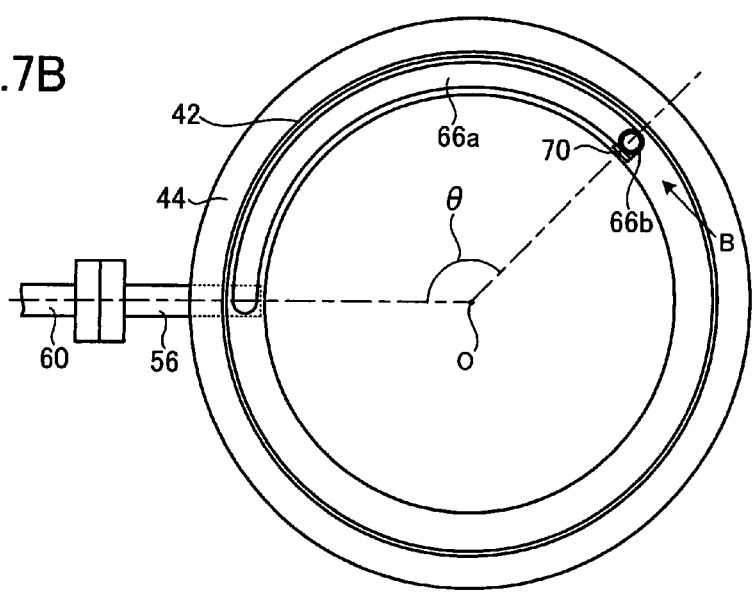

The nozzle 66 is supported by a nozzle fixing claw 70. FIG. 7(c) shows the nozzle fixing claw 70 viewed from the direction B. For example, the nozzle fixing claw 70 is formed of quartz, is provided on the adaptor 44, and arranged at the terminal end portion of the curved portion of the first portion 66a of the nozzle 66, that is, at an upright portion of the second straight portion, so as to come into contact with and support the terminal end portion of the curved portion of the first portion 66a.

In this manner, by providing the first portion 66a of the nozzle 66 so as to extend circumferentially along the inner wall of the reaction tube 42 while maintaining the constant distance from the upper surface of the adaptor 44 formed of quartz, the first portion 66a can be arranged in an area at a higher temperature than in the reaction tube 42, and hence gas in the first portion 66a of the nozzle 66 is sufficiently preheated, so that the gas is sufficiently heated when passing through the second portion 66b, and also when being injected from the gas injection port at the distal end of the second portion 66b into the reaction chamber. Accordingly, partial temperature decrease in the reaction chamber, in particular, in the substrate arranged area may further be prevented, and hence temperature distribution in the reaction chamber may be uniformized and, by the same logic, a uniform treatment may be performed between the surfaces of the wafers, and on the surfaces thereof.

Subsequently, a second modification of the first portion 66a in the second embodiment will be described. FIG. 8 shows the second modification of the first portion 66a.

The first portion 66a is formed of quartz, is placed on the upper surface of the adaptor 44 in the reaction tube 42, and is formed at the both outer edge portions with the small depressions (small diameter portions) 68 having an outer diameter smaller than other portions. One of the depressions 68 of the first portion 66a is fitted to the nozzle mounting hole 64a of the adaptor 44 formed of quartz, and the other depression 68 is fitted into the second portion 66b formed of SiC.

Figure 8A:
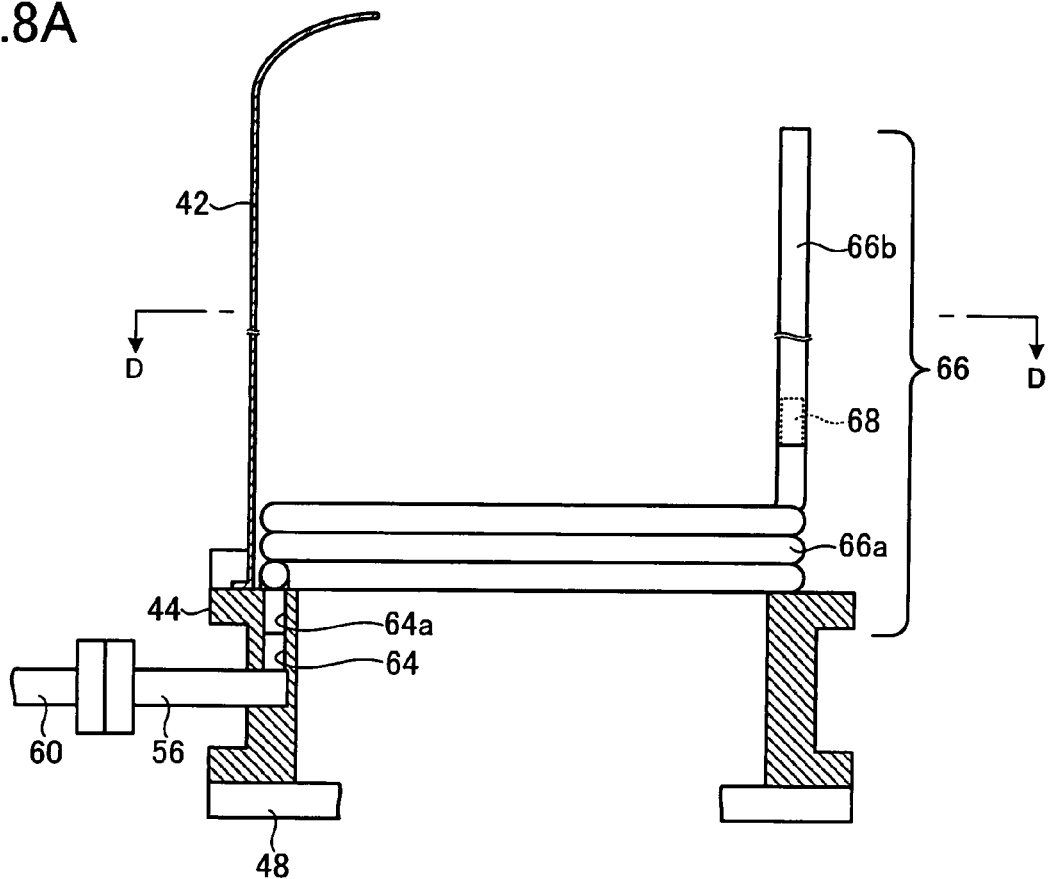
FIG. 8 illustrates a second modification of the nozzle portion used in the heat treatment apparatus according to the second embodiment of the present invention, in which (a) is a cross-sectional view of the nozzle portion and (b) is a cross-sectional view taken along the line D-D in (a).
Figure 8B:
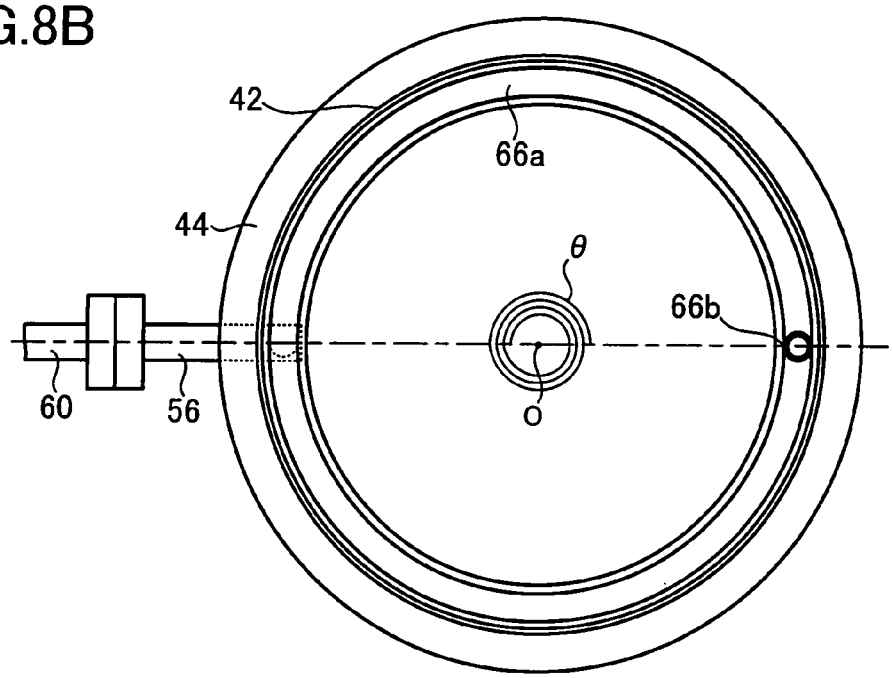

As shown in FIGS. 8(a), (b), the first portion 66a includes a curved portion and a straight portion, and the curved portion is formed so as to extend circumferentially along the inner wall of the reaction tube 42 while keeping in adjacent to the upper surface of the adaptor 44. That is, the curved portion of the first portion 66a is placed on the upper surface of the adaptor 44 in the reaction tube 42 between the inner wall of the reaction tube 42 and the inner peripheral edge of the adaptor 44, and is provided concentrically with the adaptor 44 or the reaction tube 42 so as to extend circumferentially along the inner wall of the reaction tube 42. In this embodiment, the curved portion of the first portion 66a of the nozzle 66 is in contact with the upper surface of the adaptor 44 at a portion protruding inwardly with respect to the inner wall of the reaction tube 42, and the curved portion of the first portion 66a is supported by the upper surface. The nozzle 66 (the first portion 66a, the second portion 66b) is arranged so as not to come into contact with the reaction tube 42 (so as to define a gap between the nozzle 66 and the reaction tube 42). When a range in which the curved portion of the first portion 66a is arranged on the upper surface of the adaptor 44 is represented by a center angle of the curved portion, that is, an angle θ formed by two straight lines (radii) connecting both ends of the curved portion (the position of the nozzle mounting hole 64a, the position where the straight portion of the first portion 66a is arranged) and a center point O of the curved portion, the angle θ is; θ=360° or larger. Therefore, as shown in FIG. 8(a), the curved portion of the first portion 66a is wound in a helical shape so as to be layered in the vertical direction. This curved portion is formed in the above-mentioned predetermined angular range and the straight portion is formed so as to extend upright in the vertical direction further from the terminal of the curved portion. The second straight portion is formed with the above-mentioned depressions 68 at the distal end thereof and is fitted into the second portion 66b of the nozzle 66.

In this manner, with the provision of the first portion 66a of the nozzle 66 extending circumferentially along the inner wall of the reaction tube 42 so as to be layered from the upper surface of the adaptor 44 formed of quartz in the vertical direction, the length of the first portion 66a of the nozzle 66 is elongated. Therefore, the duration where gas stays in the nozzle 66 from being injected into the first portion 66a of the nozzle 66 until passing through the second portion 66b, and also until being discharged into the reaction tube 42 is increased, so that the gas is sufficiently preheated in the first portion 66a of the nozzle 66, and hence the gas is sufficiently heated when passing through the second portion 66b and also when being injected from the gas injection port at the distal end of the second portion 66b into the reaction chamber. Accordingly, partial temperature decrease in the reaction chamber, in particular, in the substrate arranged area may further be prevented, and hence temperature distribution in the reaction chamber may further be uniformized and, by the same logic, a uniform treatment may be performed between the surfaces of the wafers, and on the surfaces thereof.

Figure 9:
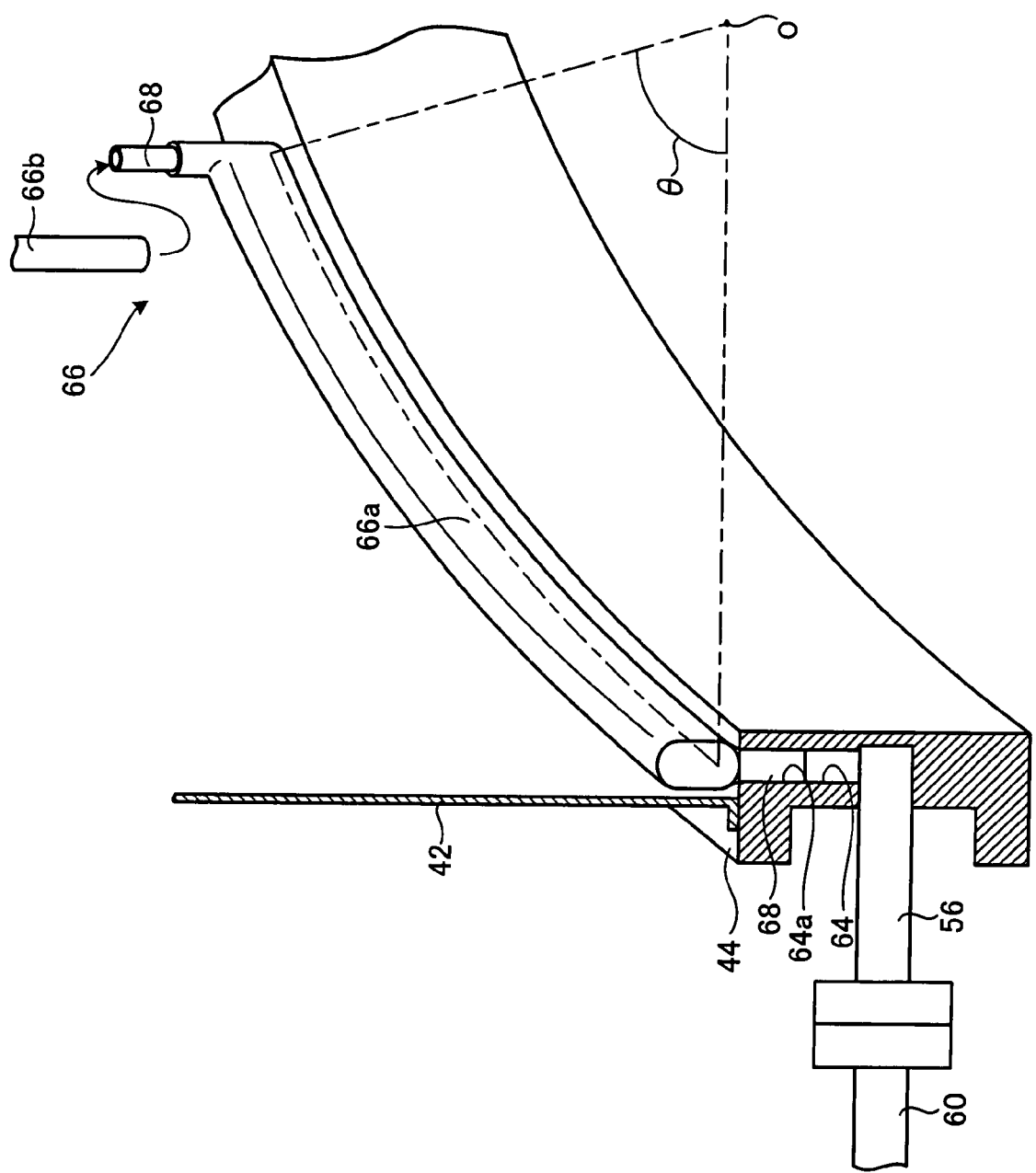
FIG. 9 is an enlarged perspective view showing a third modification of the nozzle portion used in the heat treatment apparatus according to the second embodiment of the present invention.

Subsequently, a third modification of the first portion 66a in the second embodiment will be described. FIG. 9 shows the third modification of the first portion 66a.

As shown in FIG. 9, the first portion 66a formed of quartz includes a curved portion and a straight portion, and is placed on the upper end surface of the adaptor 44 in the reaction tube 42. The cross-sectional area of a gas flow channel in the portion extending circumferentially along the inner wall of the reaction tube 42 of the first portion 66a (curved portion) is formed to be larger than the portion extending in the direction of arrangement of the substrate (straight portion). That is, the cross-sectional area of the gas flow channel of the curved portion in the first portion 66a of the nozzle 66 is formed to be larger than the straight portion of the first portion 66a of the nozzle 66 and the cross-sectional area of the gas flow channel in the second portion 66b of the nozzle 66 formed of SiC. In other words, the cross-sectional area of the gas flow channel, that is, the capacity of the gas flow channel in the curved portion of the first portion 66a of the nozzle 66 in this example is larger than the curved portion of the first portion 66a of the nozzle 66 in the second embodiment described above.

The cross-sectional shape of the flow channel in the curved portion of the first portion 66a of the nozzle 66 (the portion extending circumferentially along the reaction tube 42) in this example is, for example, an oval shape, which is a non-circular shape.

In this manner, the cross-sectional area of the gas flow channel in the portion of the nozzle 66 extending circumferentially along the inner wall of the reaction tube 42 (the curved portion of the first portion 66a of the nozzle 66) is formed so as to be larger than the cross-sectional area of the gas flow channel in the portion extending in the direction of arrangement of the substrates (the straight portion of the first portion 66a and the second portion 66b). Accordingly, the nozzle 66 is configured in such a manner that the flow rate of gas is slower in the case of passing through the first portion 66a than the case of passing through the second portion 66b, so that the flow rate of gas in the first portion 66a of the nozzle 66 can be lowered, whereby preheating of the gas in the first portion 66a can be achieved further sufficiently (the efficiency of preheating may be improved). Therefore, the gas is sufficiently heated when passing through the second portion 66b and also when being injected from the gas injection port at the distal end of the second portion 66b into the reaction chamber. Accordingly, partial temperature decrease in the reaction chamber, in particular, in the substrate arranged area may further be prevented, and hence temperature distribution in the reaction chamber may be uniformized and, by the same logic, a uniform treatment may be performed between the surfaces of the wafers, and on the surfaces thereof.

Also, with the cross-sectional shape of the flow channel in the portion of the nozzle 66 extending circumferentially along the inner wall of the reaction tube 42 (the curved portion of the first portion 66a of the nozzle 66) formed into the oval shape elongated in the vertical direction (extending in the vertical direction) (arranging the long axis thereof in the vertical direction and the short axis thereof in the horizontal direction), the cross-sectional area of the curved portion of the first portion 66a of the nozzle 66 may be increased in a limited space (a space between the inner wall of the reaction tube 42 on the upper surface of the adaptor 44 and the inner peripheral edge of the adaptor 44 in the reaction tube 42), and hence the capacity of the preheating portion can be secured effectively.

Figure 10:
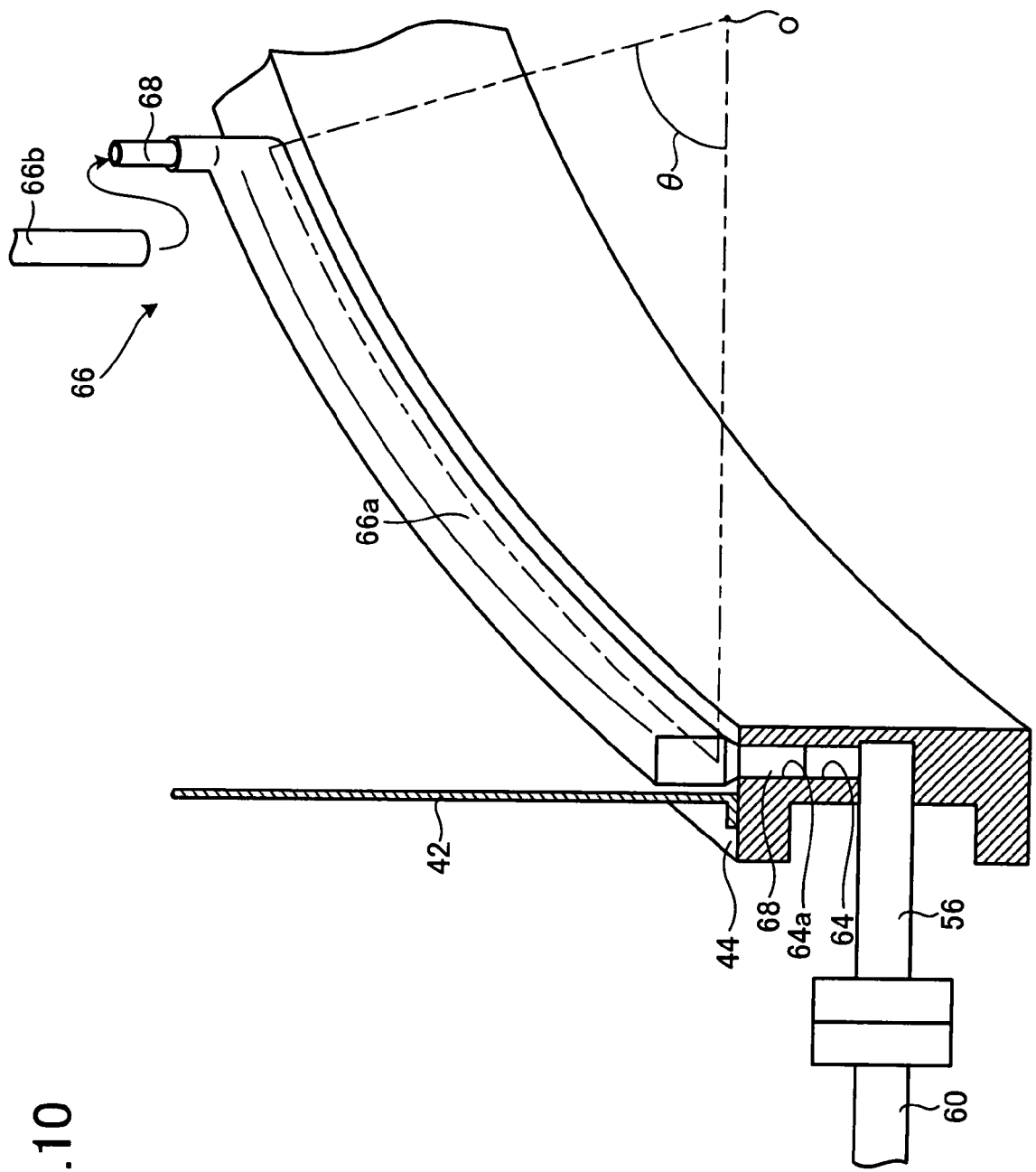
FIG. 10 is an enlarged perspective view showing a fourth modification of the nozzle portion used in the heat treatment apparatus according to the second embodiment of the present invention.

Subsequently, a fourth modification of the first portion 66a in the second embodiment will be described. FIG. 10 shows the fourth modification of the first portion 66a.

In comparison with the above-described third modification, this example is different only in cross-sectional shape of the flow channel in the curved portion of the first portion 66a. More specifically, the cross-sectional shape of the flow channel in the curved portion of the first portion 66a (the portion extending circumferentially along the inner wall of the reaction tube 42) of the nozzle 66 is a rectangular shape, which is, for example, a non-circular shape.

Therefore, the same effect as the third embodiment is achieved. With the cross-sectional shape of the flow channel in the portion of the nozzle 66 extending circumferentially along the inner wall of the reaction tube 42 (the curved portion of the first portion 66a of the nozzle 66) formed into a vertically elongated rectangular shape (arranging the long side thereof in the vertical direction and the short side thereof in the horizontal direction), the cross-sectional area of the curved portion of the first portion 66a of the nozzle 66 may be increased in a limited space (a space between the inner wall of the reaction tube 42 on the upper surface of the adaptor 44 and the inner peripheral edge of the adaptor 44 in the reaction tube 42), and hence the capacity of the preheating portion can be secured effectively.

With the cross-sectional shape of the flow channel in the portion of the nozzle 66 extending circumferentially along the inner wall of the reaction tube 42 (the curved portion of the first portion 66a of the nozzle 66) formed into a rectangular shape, a contact surface area between the curved portion of the first portion 66a of the nozzle 66 and the upper surface of the adaptor 44 increases, and hence a stable installation of the nozzle 66 is achieved.

The cross-sectional shape of the flow channel in the curved portion of the first portion 66a of the nozzle 66 (the cross-sectional shape of the flow channel in a portion extending circumferentially along the inner wall of the reaction tube 42) is not limited to the above-described oval shape or the rectangular shape, and may be any shape such as non-circular shape (deformed circle, triangle, etc.), and a circular shape.

Figure 11:
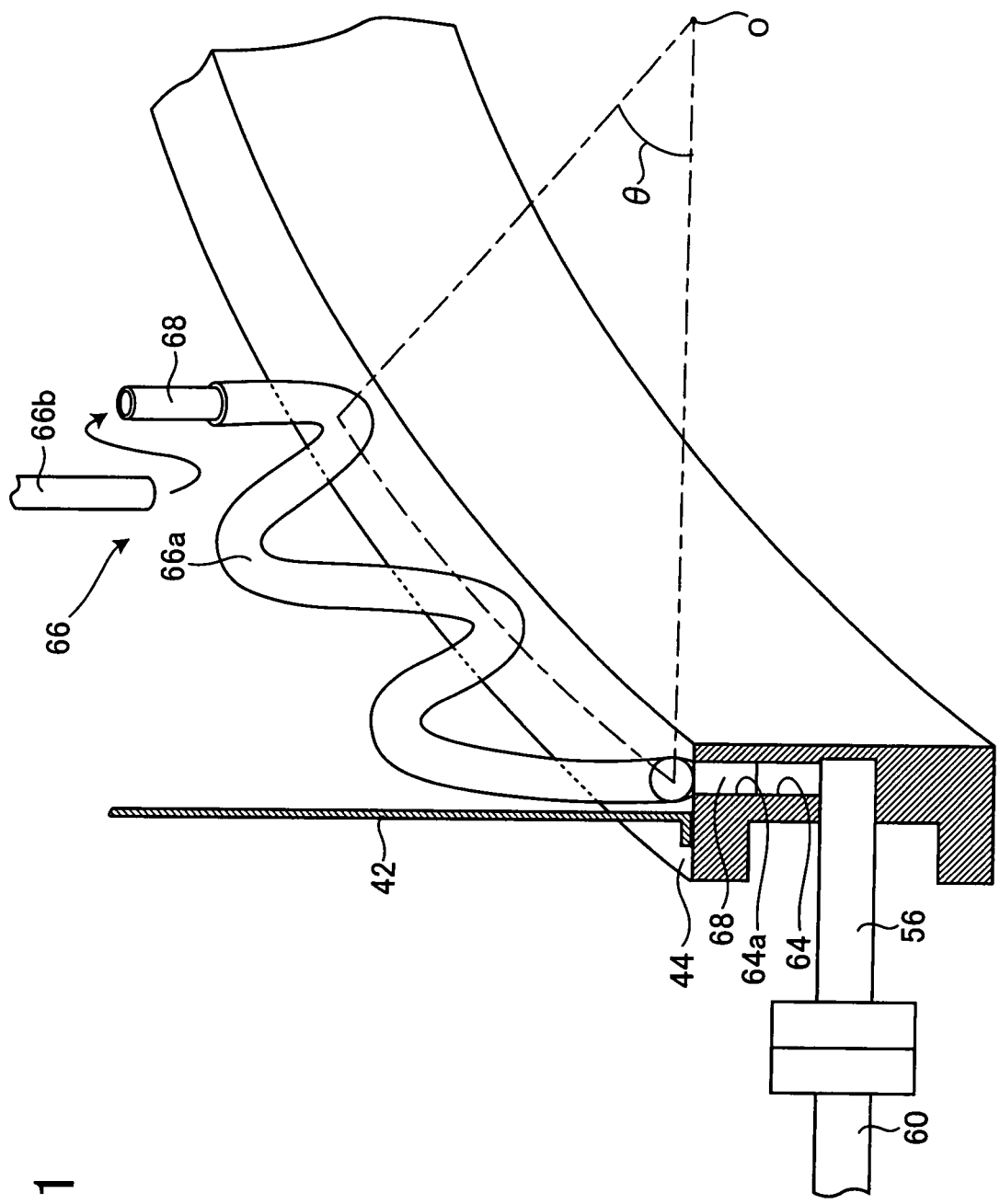
FIG. 11 is an enlarged perspective view showing a fifth modification of the nozzle portion used in the heat treatment apparatus according to the second embodiment of the present invention.

Subsequently, a fifth modification of the first portion 66a in the second embodiment will be described. FIG. 11 shows the fifth modification of the first portion 66a.

As shown in FIG. 11, the nozzle 66 includes the two portions (the first portion 66a, the second portion 66b), and the first portion 66a formed of quartz is formed so as to extend circumferentially along the inner wall of the reaction tube 42 while keeping in adjacent to (coming into contact at predetermined intervals with) the upper surface of the adaptor 44 on the side of the upper end flange so as to wind its way in the vertical direction. More specifically, the first portion 66a is placed on the upper surface of the adaptor 44 between the inner wall of the reaction tube 42 and the inner peripheral edge of the adaptor 44 in the reaction tube 42, is provided concentrically with the adaptor 44 or the reaction tube 42 so as to extend circumferentially along the inner wall of the reaction tube 42, and is formed into a wave shape in the vertical direction.

The first portion 66a is formed at the terminal portion thereof with the straight portion so as to extend upright in the direction of arrangement of the substrate (vertical direction). The straight portion is formed at the distal (terminal) end thereof with the above-mentioned depression (small diameter portion) 68 and is fitted into the second portion 66b formed of SiC. Therefore, the straight portion of the first portion 66a and the second portion 66b are formed so as to extend in the direction of arrangement of the substrates. The nozzles 66 (the first portion 66a, the second portion 66b) are arranged so as not to come into contact with the reaction tube 42 (so as to define a gap between the nozzle 66 and the reaction tube 42).

In this manner, with the first portion 66a of the nozzle 66 formed so as to extend circumferentially along the inner wall of the reaction tube 42 and to wave in the vertical direction, the length of the first portion 66a (the preheating portion) of the nozzle 66 may be elongated also in a limited space (a space on the upper surface of the adaptor 44 between the inner wall of the reaction tube 42 and the inner peripheral edge of the adaptor 44 in the reaction tube 42). In addition, the first portion 66a may be arranged in an area at a higher temperature in the reaction tube 42 at predetermined intervals. Therefore, gas is sufficiently preheated in the first portion 66a of the nozzle 66, and when the gas passes through the second portion 66b, and also when the gas is injected into the reaction chamber from the gas injection port at the distal end of the second portion 66b, the gas is more sufficiently heated. Accordingly, partial temperature decrease in the reaction chamber, in particular, in the substrate arranged area may further be prevented, and hence temperature distribution in the reaction chamber may be uniformized and, by the same logic, a uniform treatment may be performed between the surfaces of the wafers, and on the surfaces thereof.

Figure 12:
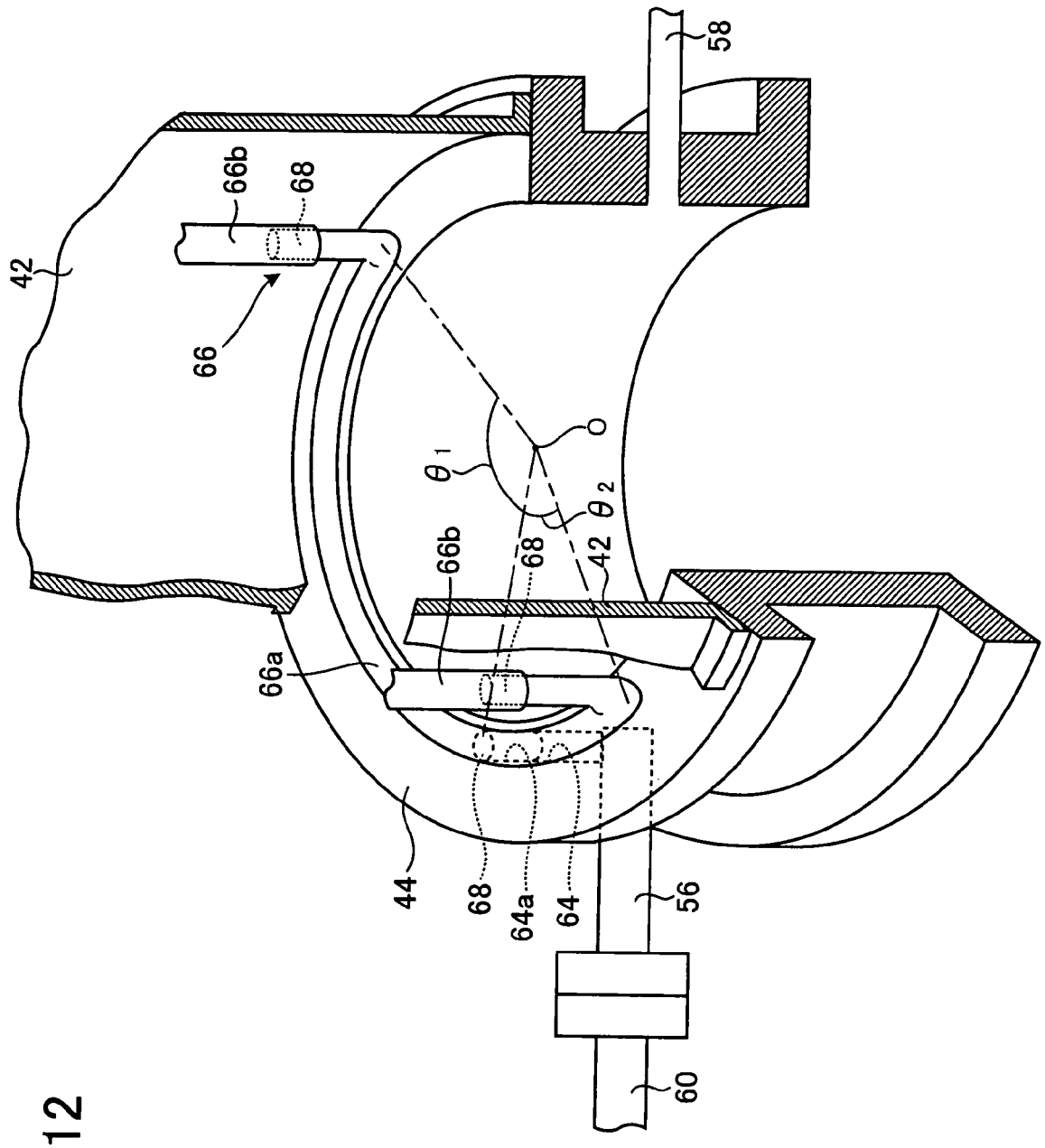
FIG. 12 is an enlarged perspective view showing a sixth modification of the nozzle portion used in the heat treatment apparatus according to the second embodiment of the present invention.

Subsequently, a sixth modification of the first portion 66a in the second embodiment will be described. FIG. 12 shows the sixth modification of the first portion 66a.

As shown in FIG. 12, the nozzle 66 includes the two portions (first portion 66a, the second portions 66b, 66b), and the first portion 66a formed of quartz includes the curved portion and the straight portion. The curved portion of the first portion 66a is formed into an arcuate shape so as to be bifurcated (into to parts) from the nozzle mounting hole 64a as a branch point and extend circumferentially along the inner wall of the reaction tube 42 while keeping in adjacent to the upper surface of the adaptor 44 on the side of the upper end flange. That is, the both of the bifurcated curved portions of the first portion 66a are placed on the upper surface of the adaptor 44 between the inner wall of the reaction tube 42 and the inner peripheral edge of the adaptor 44 in the reaction tube 42, and provided concentrically with the adaptor 44 or the reaction tube 42 so as to extend circumferentially along the inner wall of the reaction tube 42. The nozzle 66 (the first portion 66a, the second portions 66b, 66b) is arranged so as not to come into contact with the reaction tube 42 (so as to form a gap between the nozzle 66 and the reaction tube 42).

The first portion 66a is formed with the straight portions at the respective terminal ends of both of the bifurcated curved portions so as to extend upright in the direction of arrangement of the substrates (vertical direction). The two straight portions are formed with the above-described depressions (small diameter portions) 68, 68 at the terminal ends (distal ends) thereof and are inserted into the two second portions 66b, 66b formed of SiC. Therefore, the two straight portions of the first portion 66a and the two second portions 66b, 66b are arranged so as to extend in the direction of arrangement of the substrates.

In this manner, the nozzle 66 includes the first portion 66a having the bifurcated curved portions (the portion extending circumferentially along the inner wall of the reaction tube 42) and the two straight portions and the two second portions 66b, 66b (two nozzles formed of SiC).

When a range in which one of the two bifurcated curved portions of first portion 66a arranged on the upper surface of the adaptor 44 is represented by a center angle of the curved portion formed into an arcuate shape, that is, an angle θ1 formed by two straight lines (radii) connecting both ends of the curved portion (the position of the nozzle mounting hole 64a, the position where the straight portion of one of the first portions 66a is arranged) and a center point O of the curved portion, the angle θ1 is; θ1=45° to 180°. On the other hand, when a range in which the curved portion of the other one of the bifurcated first portions 66a arranged on the upper surface of the adaptor 44 is represented by a center angle of the curved portion formed into an arcuate shape, that is, an angle θ2 formed by two straight lines (radii) connecting both ends of the curved portion (the position of the nozzle mounting hole 64a, the position where the other straight portion of the first portion 66a is arranged) and a center point O of the curved portion, the angle θ2 is; θ2=45° to 180°. The range (angle) to a position where the straight portion of one of the first portions 66a is arranged may be 180° or larger as long as the both of the bifurcated curved portions of the first portion 66a do not interfere with each other.

In this manner, since the portion extending circumferentially along the inner wall of the reaction tube 42 of the nozzle 66 (the curved portion of the nozzle 66) is bifurcated and hence the two second portions 66b, 66b (two nozzles formed of SiC) are provided, the flow rate of the gas in the first portion 66a of the nozzle 66 is lowered. In addition, the flow rate of the gas in the two second portions 66b, 66b is lowered. That is, by increasing the number of nozzles, and reducing the flow rate per nozzle, the flow rate of the gas in the nozzle 66 is lowered. Accordingly, preheating of the gas in the first portion 66a of the nozzle 66 is achieved further sufficiently (the efficiency of preheating may be improved). Therefore, the gas is sufficiently heated when passing through the second portion 66b and also when being injected from the gas injection port at the distal end of the second portion 66b into the reaction chamber. Accordingly, partial temperature decrease in the reaction chamber, in particular, in the substrate arranged area may further be prevented, and hence temperature distribution in the reaction chamber may be uniformized and, by the same logic, a uniform treatment may be performed between the surfaces of the wafers, and on the surfaces thereof.

In this example, the heat treatment apparatus 10 having the two second portions 66b in a shape in which the curved portion of the first portion 66a of the nozzle 66 is bifurcated has been described. However, the invention is not limited thereto as long as there are at least two second portions 66b of the nozzle 66, and hence a configuration in which the first portion 66a is branched into three or more portions and three or more second portions 66a are provided may also be applicable. The cross-sectional shape of the flow channel in the curved portion of the nozzle 66 may be any shape such as a non-circular shape (rectangular shape, oval, deformed circle, etc.), and a circular shape.

The above-descried embodiments or the modifications may be combined for use as needed. For example, the fourth modification in the second embodiment shown in FIG. 10 may be applied to the sixth modification in the second embodiment shown in FIG. 12, and hence the rectangular shape, that is, the non-circular shape, may be employed as the cross-sectional shape of the flow channel in the curved portion of the first portion 66a in the sixth modification.

The heat treatment apparatus in the present invention may be applied to a manufacturing process for substrates.

An example in which the heat treatment apparatus according to the present invention is applied to one stage of the manufacturing process for SIMOX (Separation by Implanted Oxygen) wafers, which is one of the SOI (Silicon On Insulator) wafers will be described.

In the first step, oxygen ion is injected into a monocrystal silicon wafer by an ion injection apparatus or the like. Then, using the heat treatment apparatus in the above-described embodiments, the wafers after having injected the oxygen ion is annealed at a high temperature of 1300° C. to 1400° C., for example, at a temperature of 1350° C. or higher, for example, under Ar, $O_2$ atmosphere. With the treatment as shown above, the SIMOX wafer having the $SiO_2$ layer is formed in the interior of the wafer (having the $SiO_2$ layer embedded therein) is obtained.

In addition to the SIMOX wafer, it is also possible to apply the heat treatment apparatus according to the present invention to one stage of a manufacturing process for hydrogen annealed wafers or Ar annealed wafers. In this case, the wafers are annealed at a high temperature on the order of 1200° C. or higher in a hydrogen atmosphere or in an Ar atmosphere using the heat treatment apparatus according to the present invention. Accordingly, crystal defects of the surface layer of the wafer on which an IC (integrated circuit) can be formed may be reduced, and perfectibility of crystal is improved.

In addition to it, it is also possible to apply the heat treatment apparatus according to the present invention to one stage of a manufacturing process for epitaxial wafers.

Even when the high-temperature annealing process as one stage of the above-describe manufacturing process for substrates is performed, damage or the like of the nozzle can be prevented by using the heat treatment apparatus according to the present invention.

The heat treatment apparatus according to the present invention may be applied to a manufacturing process for semiconductor devices.

In particular, it is preferable to apply the heat treatment apparatus to a heat treatment process performed at a relatively high temperature, for example, heat oxidizing processes such as wet oxidation, dry oxidation, hydrogen burning oxidation (pyrogenic oxidation), or HCl oxidation, or heat diffusing process for diffusing impurities (dopant) such as boron (B), phosphorus (P), arsenic (As), or antimony (Sb) to the semiconductor thin film.

In the case in which the heat treatment process as one stage of the manufacturing process for semiconductor device as well, damage or the like of the nozzle can be prevented by using the heat treatment apparatus according to the present invention.

As described thus far, although the present invention is characterized by those described in claims, the following embodiments are also included.

(1) A method of manufacturing substrates, a method of treating the substrates, and a method of manufacturing semiconductor devices including: a step of loading substrates in a reactor having a reaction tube, an adaptor formed of quartz for supporting the reaction tube, a nozzle connected to the adaptor for supplying treatment gas into the reaction tube, and a heater provided outside the reaction tube for heating the interior of the reaction tube, a step of supplying the treatment gas into the reactor by the nozzle connected to an upper surface of the adaptor in the reaction tube formed of quartz at least at a portion connected to the adaptor and formed of silicon carbide at other portions and treating the substrates, and a step of unloading the substrate after the treatment from the reactor.

(2) A method of manufacturing substrates, a method of treating substrates and a method of manufacturing semiconductor devices including: a step of loading substrates into a reactor having a reaction tube, an adaptor for supporting the reaction tube, and a heater connected to the adaptor for heating the interior of the reaction tube, a step of supplying treatment gas into the reactor by a nozzle having a portion connected to an upper surface of the adaptor in the reaction tube and extending along the adaptor or circumferentially along the inner wall of the reaction tube and a portion extending in the direction of arrangement of the substrates and treating the substrates, and a step of unloading the substrates after the treatment from the reactor.

The invention claimed is:

1. A heat treatment apparatus comprising:
    a reaction tube for treating a substrate;
    an adaptor for supporting the reaction tube, the entire adaptor located below a lower end of the reaction tube;
    a nozzle for supplying treatment gas into the reaction tube; and
    a heater for heating an interior of the reaction tube, the heater being arranged around the reaction tube except for the adaptor;
    wherein the nozzle is disposed on an upper surface of the adaptor,
    wherein the nozzle includes a first portion and a second portion, the first portion of the nozzle being connected to the adaptor via a nozzle mounting hole formed on the upper surface of the adaptor, the second portion located above the first portion and connected to the first portion, and
    wherein the first portion is formed of a material having an equal coefficient of thermal expansion as a material forming the adaptor.

2. The heat treatment apparatus according to claim 1, wherein the first portion of the nozzle is formed of a material having a lower coefficient of thermal expansion than a material forming the second portion of the nozzle.

3. The heat treatment apparatus according to claim 1, wherein the first portion of the nozzle is formed of quartz, and the second portion of the nozzle is formed of silicon carbide.

4. The heat treatment apparatus according to claim 2, wherein the first portion of the nozzle and the second portion of the nozzle are fitted and connected and a part of the first portion of the nozzle is fitted into the second portion of the nozzle.

5. A method of manufacturing a substrate comprising:
    loading the substrate into a reactor having a reaction tube, an adaptor for supporting the reaction tube, the entire adaptor located below a lower end of the reaction tube, and a heater for heating an interior of the reaction tube, the heater being arranged around the reaction tube except for the adaptor;
    treating the substrate by supplying treatment gas into the reactor by a nozzle disposed on an upper surface of the adaptor, the nozzle including a first portion and a second portion, the first portion of the nozzle being connected to the adaptor via a nozzle mounting hole formed on the upper surface of the adaptor, the second portion being located above the first portion and connected to the first portion, the first portion being formed of a material equivalent in coefficient of thermal expansion to a material forming the adaptor; and
    unloading the substrate from the reactor after the treatment.

6. The heat treatment apparatus according to claim 1, wherein a connected part of the first portion of the nozzle and the second portion of the nozzle is located below the lower end of the heater.

7. The method of manufacturing a substrate according to claim 5, wherein a connected part of the first portion of the nozzle and the second portion of the nozzle is located below the lower end of the heater.

8. A heat treatment apparatus comprising:
    a reaction tube for treating a substrate;
    an adaptor for supporting the reaction tube, the entire adaptor located below a lower end of the reaction tube;

a nozzle for supplying treatment gas into the reaction tube; and a heater for heating an interior of the reaction tube, the heater being arranged around the reaction tube except for the adaptor;

wherein the nozzle is disposed on an upper surface of the adaptor, wherein the nozzle includes a first portion and a second portion, the first portion of the nozzle being connected to the adaptor via a nozzle mounting hole formed on the upper surface of the adaptor, the second portion being located above the first portion and connected to the first portion; and the adaptor and the first portion of the nozzle are formed of quartz, and the second portion of the nozzle is formed of silicon carbide.

9. The heat treatment apparatus according to claim 8, wherein the first portion of the nozzle and the second portion of the nozzle are fitted and connected and a part of the first portion of the nozzle is fitted into the second portion of the nozzle.

10. The heat treatment apparatus according to claim 8, wherein a connected part of the first portion of the nozzle and the second portion of the nozzle is located below the lower end of the heater.

11. A method of manufacturing a substrate comprising:

loading the substrate into a reactor having a reaction tube, an adaptor for supporting the reaction tube, fully located below a lower end of the reaction tube and being formed of quartz, and a heater for heating an interior of the reaction tube, the heater being arranged around the reaction tube except for the adaptor;

treating the substrate by supplying treatment gas into the reactor by a nozzle, the nozzle being disposed on an upper surface of the adaptor, the nozzle including a first portion and a second portion, the first portion being connected to the adaptor via a nozzle mounting hole formed on the upper surface of the adaptor, the second portion located above the first portion and connected to the first portion, the first portion being formed of quartz and the second portion being formed of silicon carbide, the entire first portion being located below a lower end of the heater; and unloading the substrate from the reactor after the treatment.

12. The method of manufacturing a substrate according to claim 11, wherein a connected part of the first portion of the nozzle and the second portion of the nozzle is located below the lower end of the heater.

13. The heat treatment apparatus according to claim 1, further comprising:

a gas introduction pipe that introduces gas to be supplied to the reaction tube; and a gas supply port connected to the gas introduction pipe.

* * * * *